United States Patent
Shimazu et al.

Patent Number: 6,062,853
Date of Patent: May 16, 2000

[54] HEAT-TREATING BOAT FOR SEMICONDUCTOR WAFERS

[75] Inventors: Tomohisa Shimazu; Ken Nakao, both of Sagamihara, Japan

[73] Assignee: Tokyo Electron Limited, Tokyo, Japan

[21] Appl. No.: 09/125,796

[22] PCT Filed: Feb. 25, 1997

[86] PCT No.: PCT/JP97/00526

§ 371 Date: Aug. 31, 1998

§ 102(e) Date: Aug. 31, 1998

[87] PCT Pub. No.: WO97/32339

PCT Pub. Date: Sep. 4, 1997

[30] Foreign Application Priority Data

| Feb. 29, 1996 | [JP] | Japan | 8-069238 |
| Jun. 28, 1996 | [JP] | Japan | 8-188731 |
| Sep. 10, 1996 | [JP] | Japan | 8-261352 |

[51] Int. Cl.$^7$ ............................. F27D 5/00
[52] U.S. Cl. .............. 432/258; 432/253; 432/261; 392/418; 211/41.18
[58] Field of Search ................ 432/253, 258, 432/261, 241; 392/418, 416; 211/41.18, 41.1; 219/405, 411, 390; 118/500, 728

[56] References Cited

FOREIGN PATENT DOCUMENTS

| 58-78423 | 5/1983 | Japan . |
| 60-213022 | 10/1985 | Japan . |
| 2-17633 | 1/1990 | Japan . |
| 4-15229 | 1/1992 | Japan . |
| 6-168902 | 6/1994 | Japan . |
| 7-45691 | 2/1995 | Japan . |
| 8-107081 | 4/1996 | Japan . |
| 8-130192 | 5/1996 | Japan . |

*Primary Examiner*—John A. Jeffery
*Assistant Examiner*—Jiping Lu
*Attorney, Agent, or Firm*—Oblon, Spivak, McClelland, Maier & Neustadt, P.C.

[57] ABSTRACT

An heat-treating ring boat (20) for semiconductor wafers (W) has a top plate (21), a bottom plate (22), six columns (23–28), and 63 ring trays (31). The trays (31) are mounted in grooves (20a) of the columns (23–28). To fix the trays (31), a fixing rod (33) is detachably mounted between the top plate (21) and bottom plate (22). A through hole (21a) and a recessed portion (22a) to mount the fixing rod (33) therein are formed in the top plate (21) and bottom plate (22). Notches (34) to engage with the fixing rod (33) are formed in the trays (31). A notch (32) to engage with the fixing rod (33) is formed in the column (23). A projection (41) is formed on each tray (31) to abut against the side surface of the column (24).

10 Claims, 23 Drawing Sheets

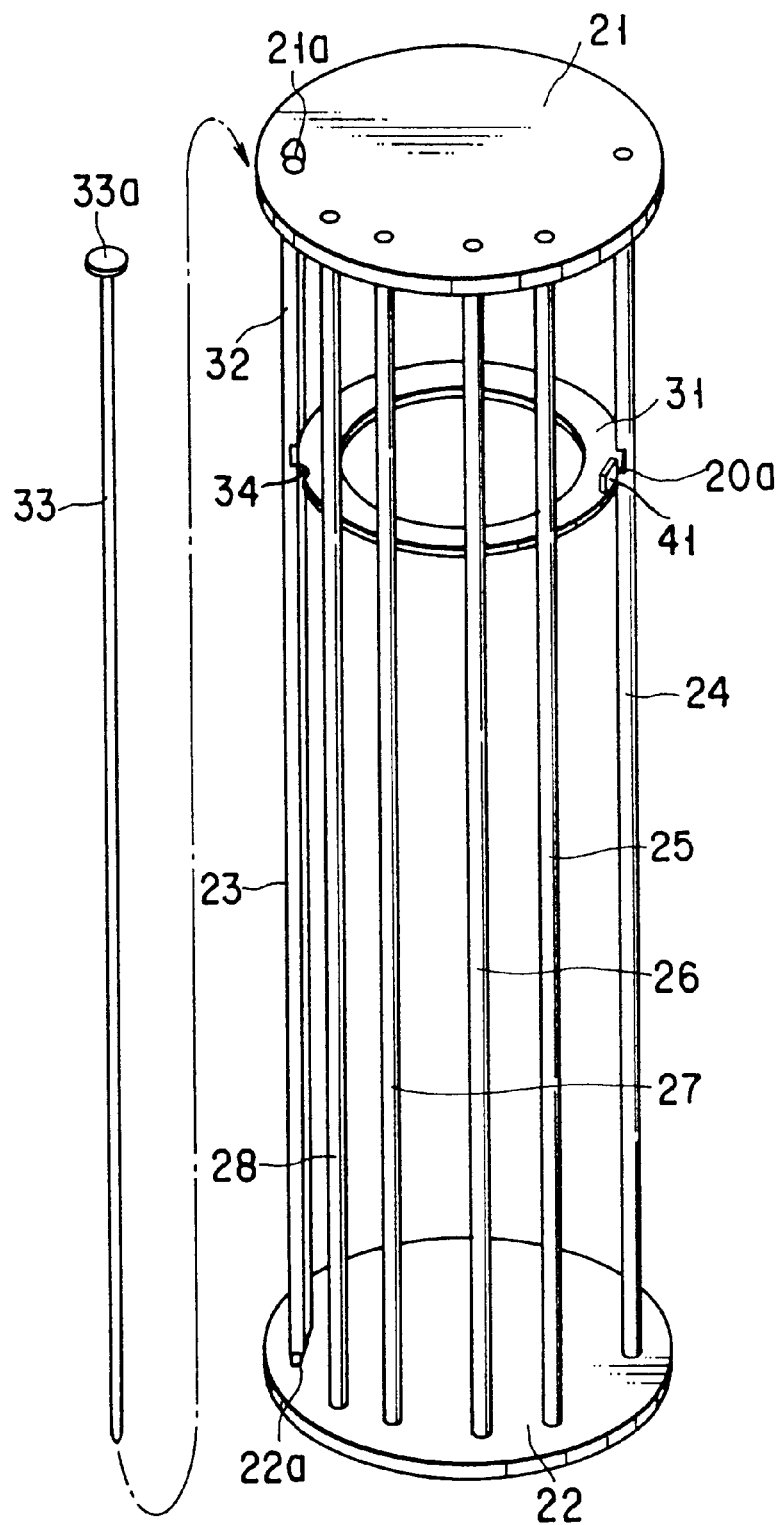
F I G. 3

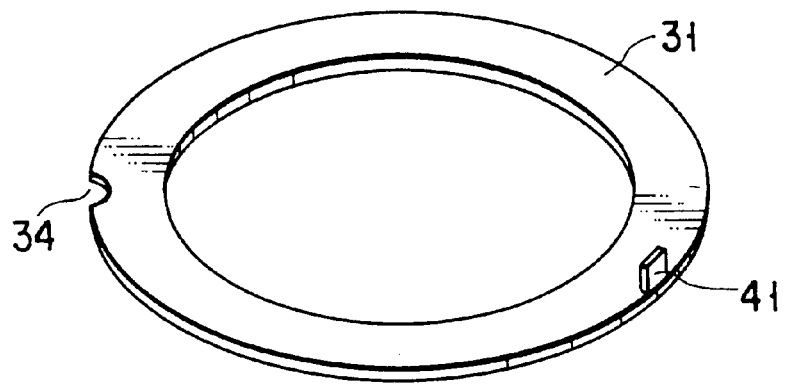
F I G. 4
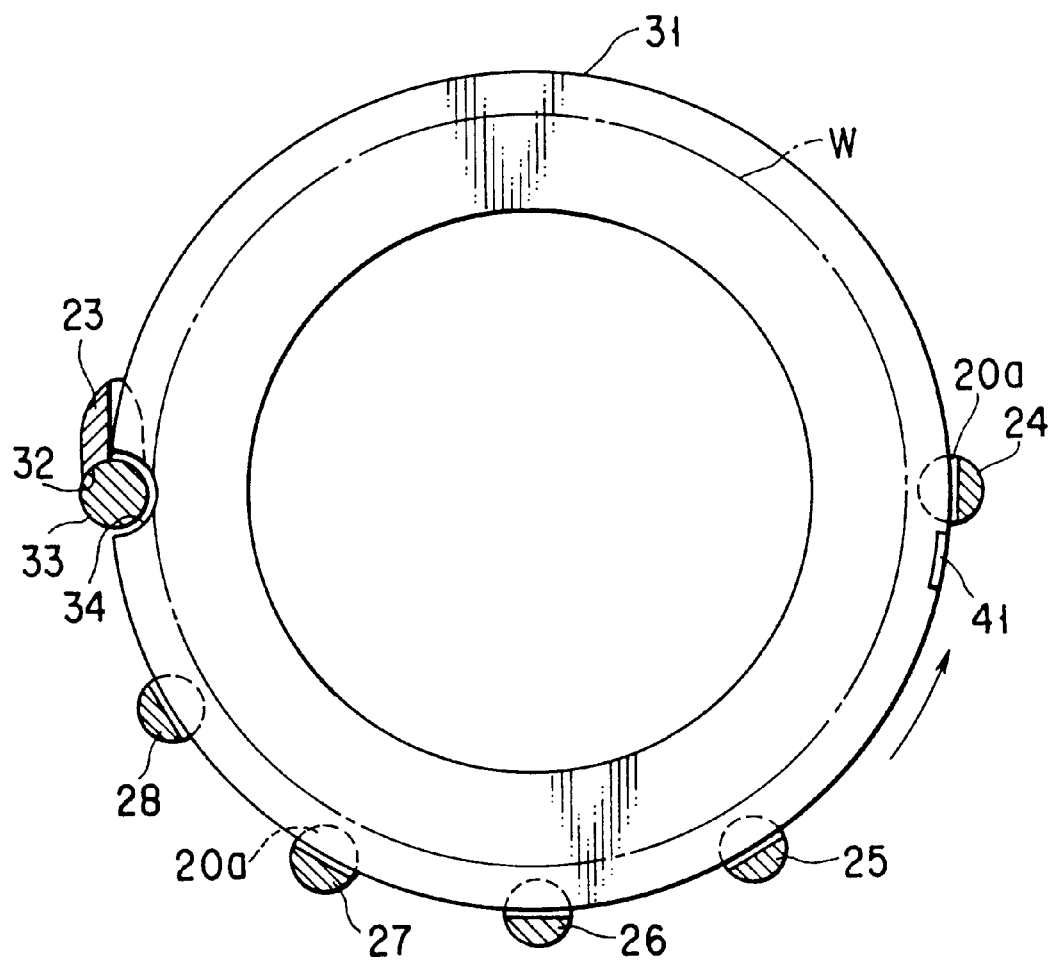
F I G. 5

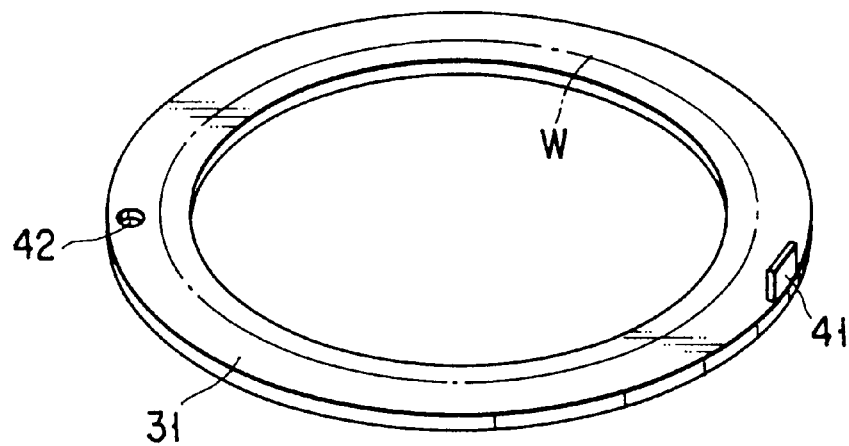
F I G. 9A
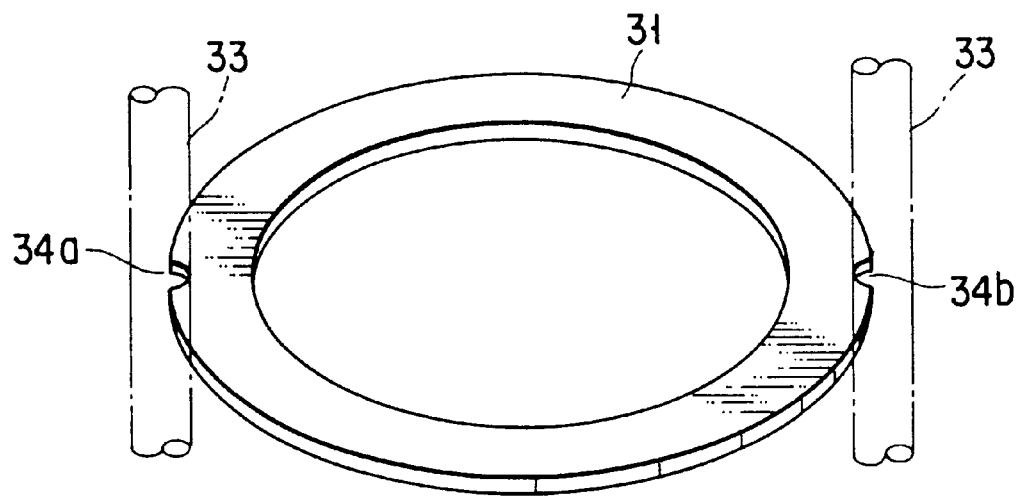
F I G. 9B

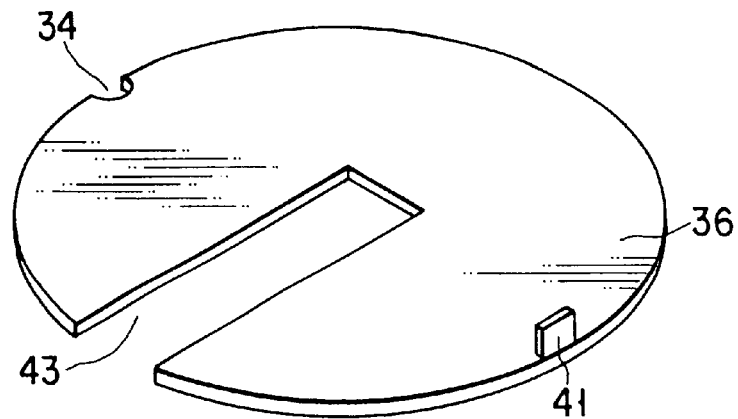
F I G. 10
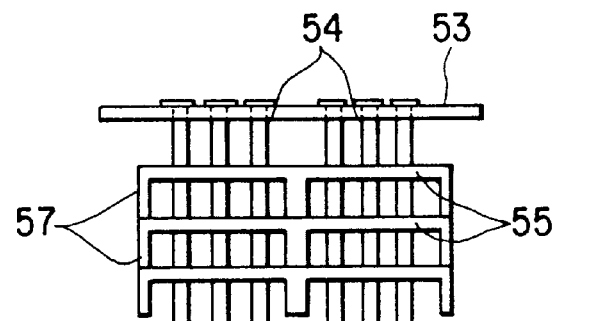
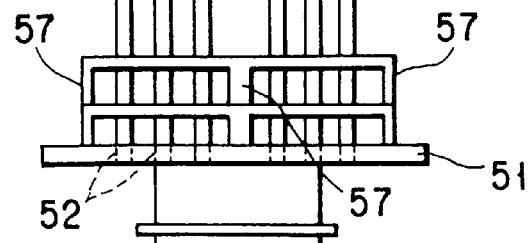
F I G. 11

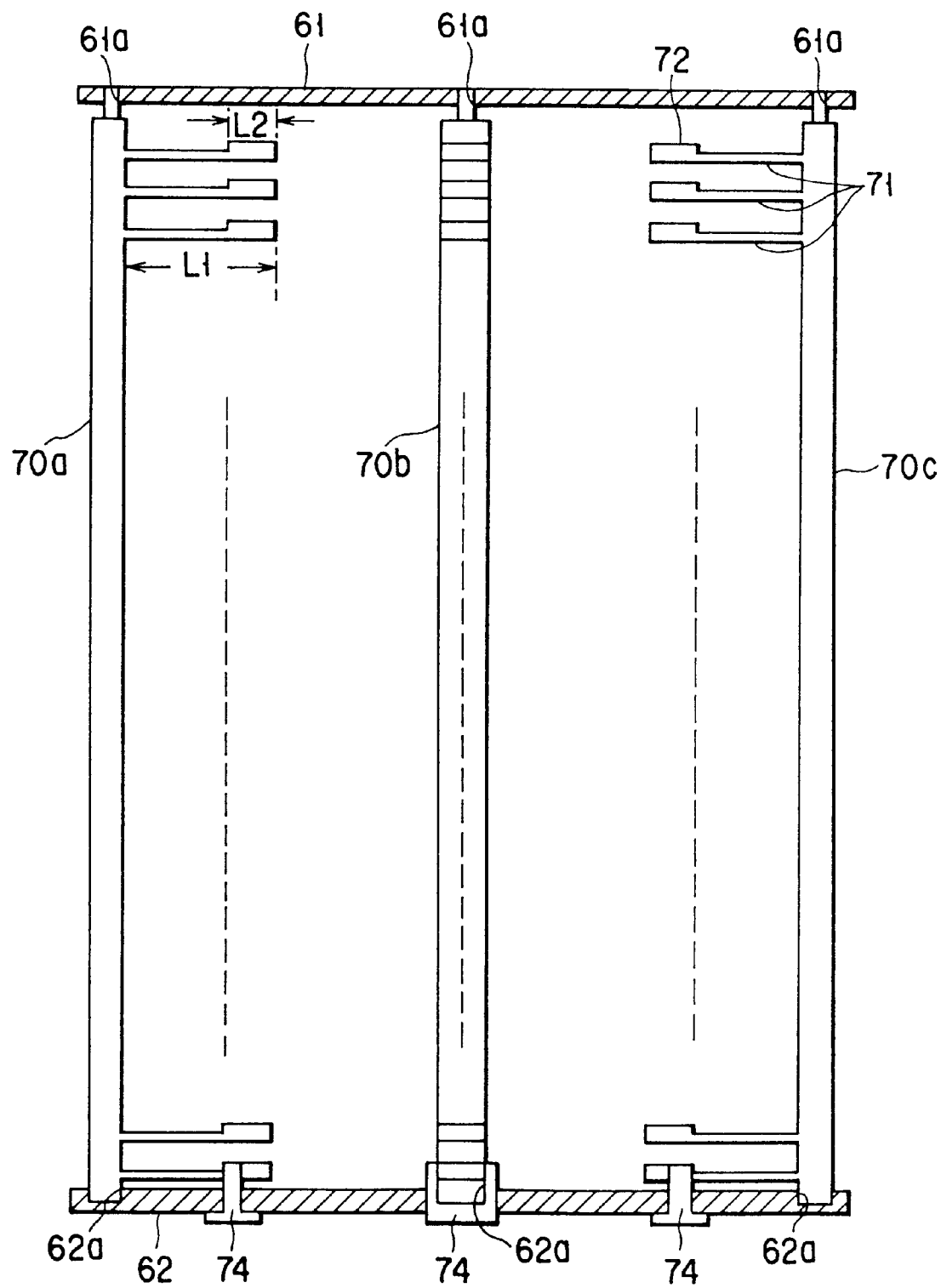
F I G. 16

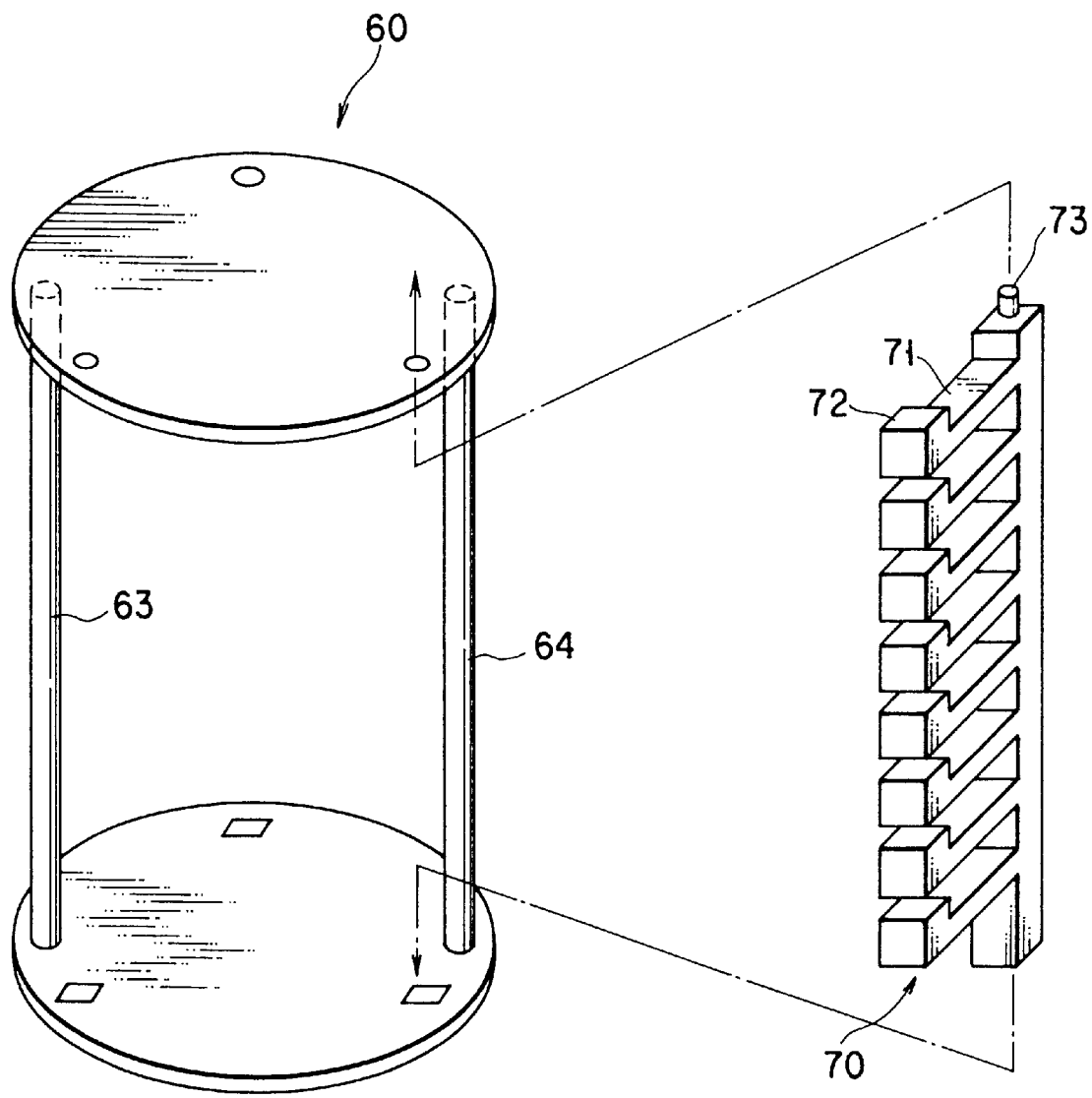
F I G. 17

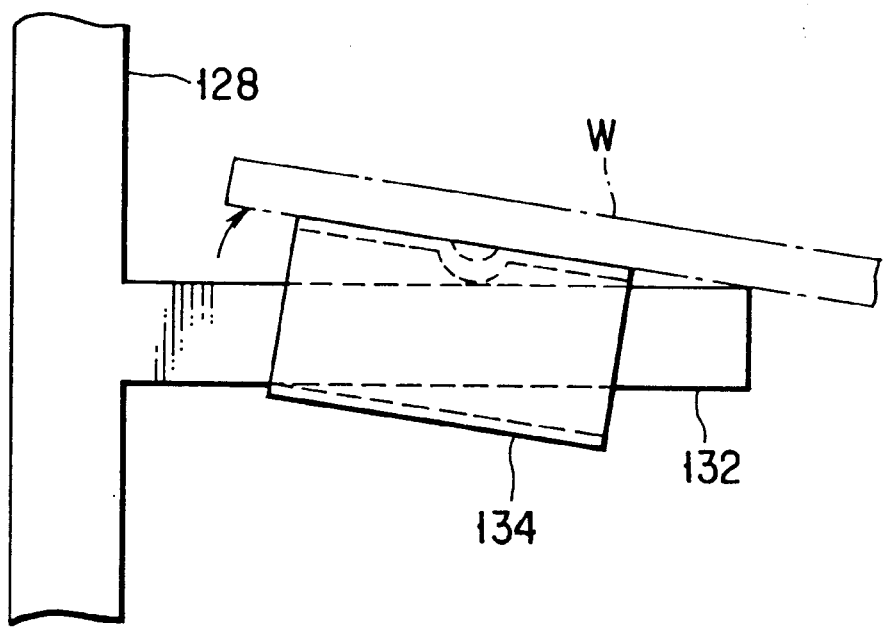
F I G. 25A
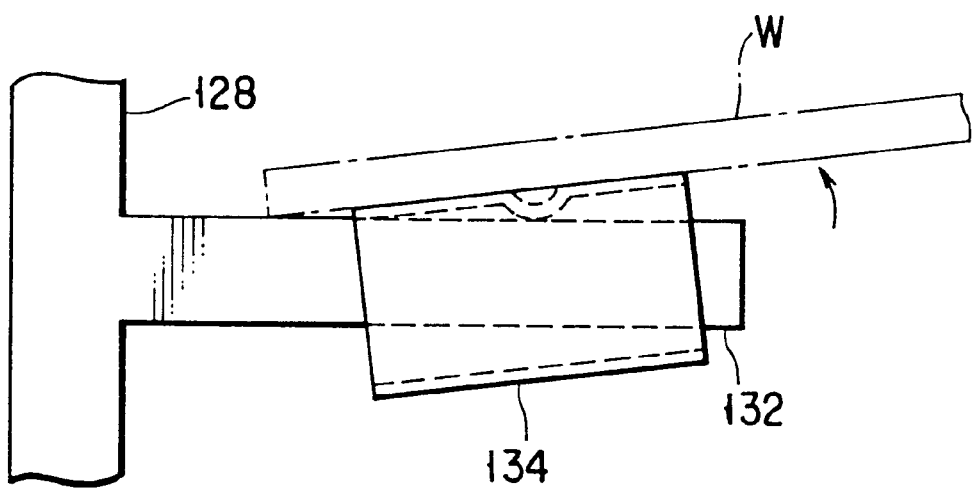
F I G. 25B

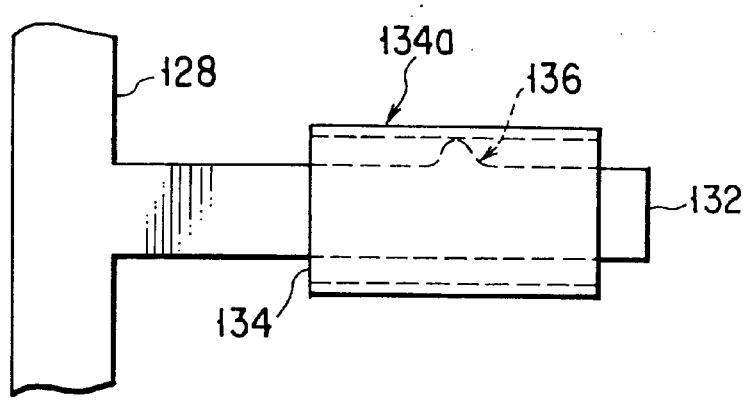
F I G. 26
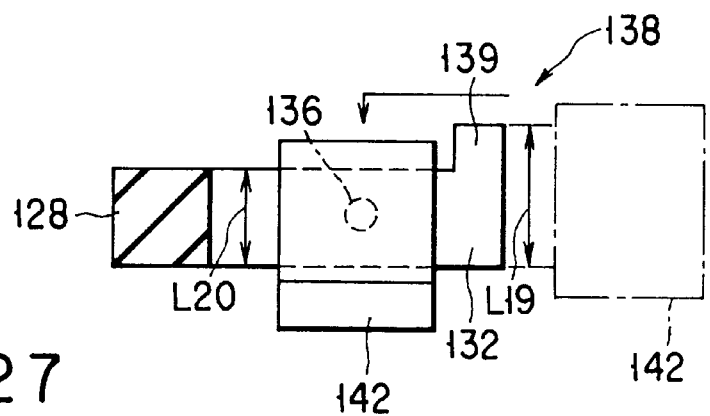
F I G. 27
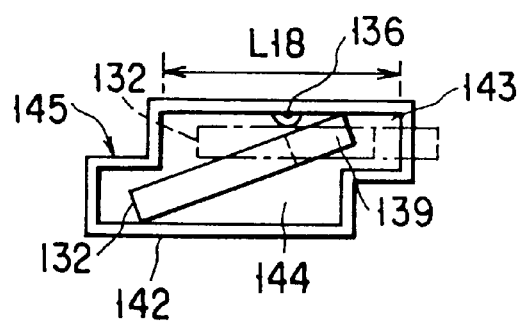
F I G. 28

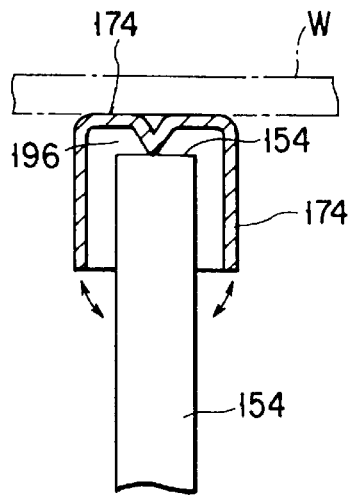
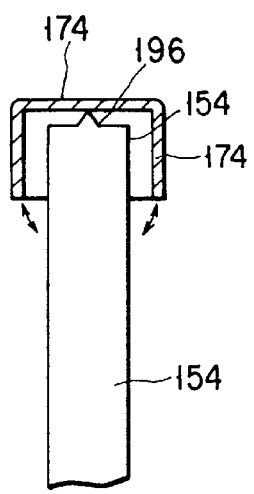
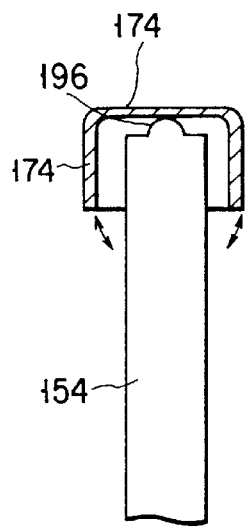
F I G. 30A     F I G. 30B     F I G. 30C
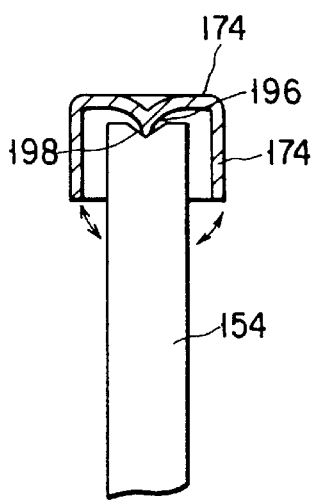
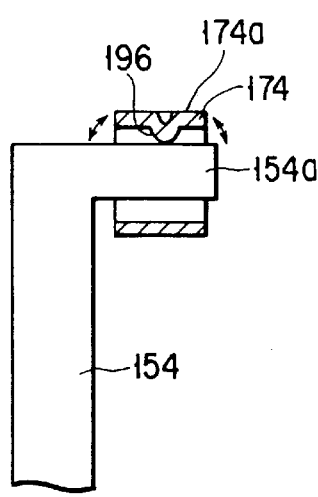
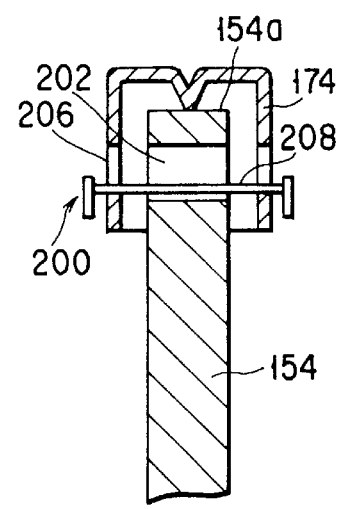
F I G. 30D     F I G. 31     F I G. 32

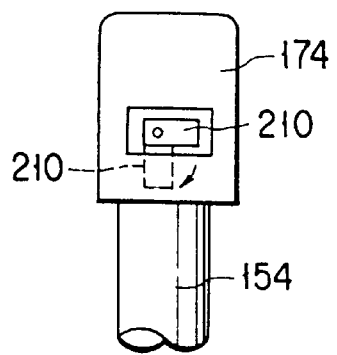
F I G. 33
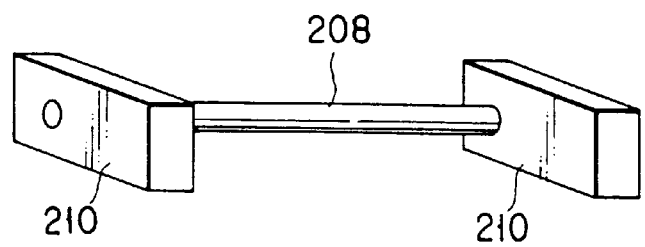
F I G. 34

6,062,853

1

HEAT-TREATING BOAT FOR SEMICONDUCTOR WAFERS

TECHNICAL FIELD

The present invention relates to a heat-treating boat for holding a plurality of semiconductor wafers in the processing chamber of a vertical heat-treating apparatus.

BACKGROUND ART

A vertical heat-treating apparatus is used to perform a heat-treating, e.g., thermal oxidation or thermal diffusion, for a plurality of semiconductor wafers (to be referred to as "wafers" hereinafter) all together, or to perform a so-called batch processing. In the heat-treating apparatus of this type, a large number of wafers are loaded in the processing chamber along with a heat-treating boat that holds the wafers in a stacked state with gaps therebetween, and predetermined heat-treating is performed.

FIGS. 35 and 36 are perspective views showing a conventional typical heat-treating boat in the vertical heat-treating apparatus.

FIG. 35 shows a heat-treating boat called a ladder boat. This boat has circular top and bottom plates 16 and 17 that are arranged above a heat-insulating cylinder 4 to vertically oppose each other, and six columns 18 made of, e.g., quartz, to connect the top plate 16 and bottom plate 17 to each other. Grooves 18a are formed in each column 18 to correspond to a plurality of levels where wafers W are to be held horizontally. The wafers W are held as their peripheral edges are inserted in the grooves 18a.

FIG. 36 shows a heat-treating boat called a ring boat. This boat similarly has circular top and bottom plates 16 and 17 that are arranged above a heat-insulating cylinder 4 to vertically oppose each other, and six columns 18 made of, e.g., quartz, to connect the top plate 16 and bottom plate 17 to each other. Ring trays 19 are fixed to the columns 18 to correspond to a plurality of levels where wafers W are to be held horizontally. The wafers W are held as their peripheral portions are placed on the trays 19.

The peripheral edge portions of the wafers are brought into contact with the ring trays 19 to increase the heat capacity of the ring boat, so that the temperature rise/fall speed at the peripheral edge portions can be decreased. Accordingly, even when the temperature rise/fall rate of heat-treating is high, the rate of temperature rise/fall at the central portion and that at the peripheral edge portion of the wafer can be set equal to each other.

As described above, in the ladder boat, each wafer is supported only at the plurality of peripheral edge portions. For this reason, a large moment corresponding to the self weight of the wafer acts on these supported portions to apply an excessive stress to the wafer. When the wafer is heated, the temperature of the peripheral edge portion of the wafer close to the heater tends to increase easily, and a temperature difference tends to occur between the central portion and peripheral edge portion of the wafer.

From these reasons, when the wafer is heat-treated at a high temperature equal to or higher than 1,050° C., a crystal defect called slip tends to occur in the wafer near the supported portions. As the diameter of the wafer increases in recent years, the weight of the wafer itself also increases, and a further countermeasure is required for the slip.

In either the ladder boat or the ring boat, a large load caused by the large number of wafers acts on the columns 18. The softening point of quartz is about 1,400° C. When

2 the wafers are heat-treated at a temperature of, e.g., about 1,000° C., the quartz columns tend to deform by heat. Furthermore, in the ring boat, distortion occurs in the trays 19, and it is difficult to uniformly heat-treat the wafers.

The ring trays 19 of the quartz ring boat are fixed to the columns 18 by welding, i.e., by fusion and adhesion caused by heat. Due to the heat during welding, some distortion may occur in the trays 19 to degrade the flatness, and heat-treating having a high planar uniformity cannot sometimes be performed for the wafers. Hence, welding of the trays 19 requires high precision to make the operation very difficult. As described above, the quartz ring trays 19 are distorted when the temperature becomes about 1,050° C. to interfere with uniform heat-treating of the wafers W. Therefore, the quartz ring trays 19 cannot be used for high-temperature heat-treating.

From the above reasons, a ladder boat and a ring boat made of silicon carbide (SiC) having a higher melting point than that of quartz are also manufactured. However, a heat-treating boat made of SiC is very expensive. Since SiC has a high melting point, a member cannot be adhered to the heat-treating boat by welding, making the manufacture difficult. In other words, in a ring boat made of SiC, ring trays cannot be fixed to the columns by welding.

DISCLOSURE OF INVENTION

It is an object of the present invention to provide a heat-treating ring boat having a simple structure that can prevent ring trays from being fixed and dropped.

It is another object of the present invention to provide a heat-treating boat that can be manufactured easily.

It is still another object of the present invention to provide a heat-treating boat in which occurrence of slip to a wafer during heat-treating can be decreased.

According to a first aspect of the present invention, there is provided a heat-treating boat for semiconductor wafers, comprising:

upper and lower frames disposed at upper and lower end portions, respectively, of the boat;

a plurality of trays disposed between the upper and lower frames at gaps therebetween in a vertical direction to regulate a plurality of horizontal wafer support levels;

first, second, and third columns disposed between the upper and lower frames and each connected to the upper and lower frames, the first, second, and third columns detachably supporting the plurality of trays and being arranged to define an inlet port through which the wafers are loaded in and unloaded from the boat;

first and second holes formed in the upper and lower frames, respectively;

notches respectively formed in the trays, the first and second holes and the notches being aligned with each other in the vertical direction; and a rod detachably connected to the upper and lower frames through the first and second holes and inserted in the notches to position the plurality of trays relative to the first, second, and third columns.

According to a second aspect of the present invention, there is provided a heat-treating boat for substantially circular semiconductor wafers, comprising:

upper and lower frames disposed at upper and lower end portions, respectively, of the boat;

first, second, and third columns disposed between the upper and lower frames and each connected to the upper and lower frames, the first, second, and third columns being arranged to define an inlet port through which the wafers are loaded in and unloaded from the boat;

a plurality of first beams, a plurality of second beams, and a plurality of third beams respectively connected to the first, second, and third columns to be spaced apart from each other in a vertical direction and extending inward the boat; and first, second, and third support portions formed on distal end portions of the first, second, and third beams, respectively, to define a plurality of horizontal wafer support levels, each of the wafer support levels being formed by a set of one of the first support portions, one of the second support portions, and one of the third portions that are located at a corresponding height, wherein each of the support portions is set such that an innermost end position thereof that comes into contact with a lower surface of the wafer is located within a range of 0.6 D to 0.95 D on the lower surface of the wafer where D is a diameter of the wafer.

BRIEF DESCRIPTION OF THE DRAWINGS

FIG. 3 is a perspective view showing the boat shown in FIG. 2;

FIG. 4 is a perspective view showing a ring tray of the boat shown in FIG. 2;

FIG. 5 is a cross-sectional plan view showing a state wherein the tray shown in FIG. 4 is fixed with columns and a fixing rod;

FIGS. 9A and 9B are perspective views respectively showing modifications of the tray shown in FIG. 4;

FIG. 10 is a perspective view showing a modification of the tray shown in FIG. 4;

FIG. 11 is a side view showing a heat-treating boat according to another embodiment of the present invention;

FIG. 16 is a longitudinally sectional side view showing the boat shown in FIG. 14;

FIG. 17 is an exploded perspective view of part of the boat shown in FIG. 14;

FIGS. 25A and 25B are views showing how the swing element shown in FIG. 22 operates;

FIG. 26 is a side view showing a modification of the swing element shown in FIG. 22;

FIG. 27 is a plan view showing a modification of the swing element shown in FIG. 22 which has a drop preventive mechanism;

FIG. 28 is a side view showing how to mount the swing element shown in FIG. 27;

FIGS. 30A to 30D are views showing the wafer support structure of the apparatus shown in FIG. 29, and its modifications;

FIG. 31 is a view showing a modification of the wafer support structure of the apparatus shown in FIG. 29;

FIG. 32 is a sectional view showing a modification in which a drop preventive mechanism is attached to the swing element of the apparatus shown in FIG. 29;

FIG. 33 is a side view showing the swing element and drop preventive mechanism shown in FIG. 32;

FIG. 34 is a perspective view showing the lock pin of the drop preventive mechanism shown in FIG. 32;

BEST MODE OF CARRYING OUT THE INVENTION

Figure 1:
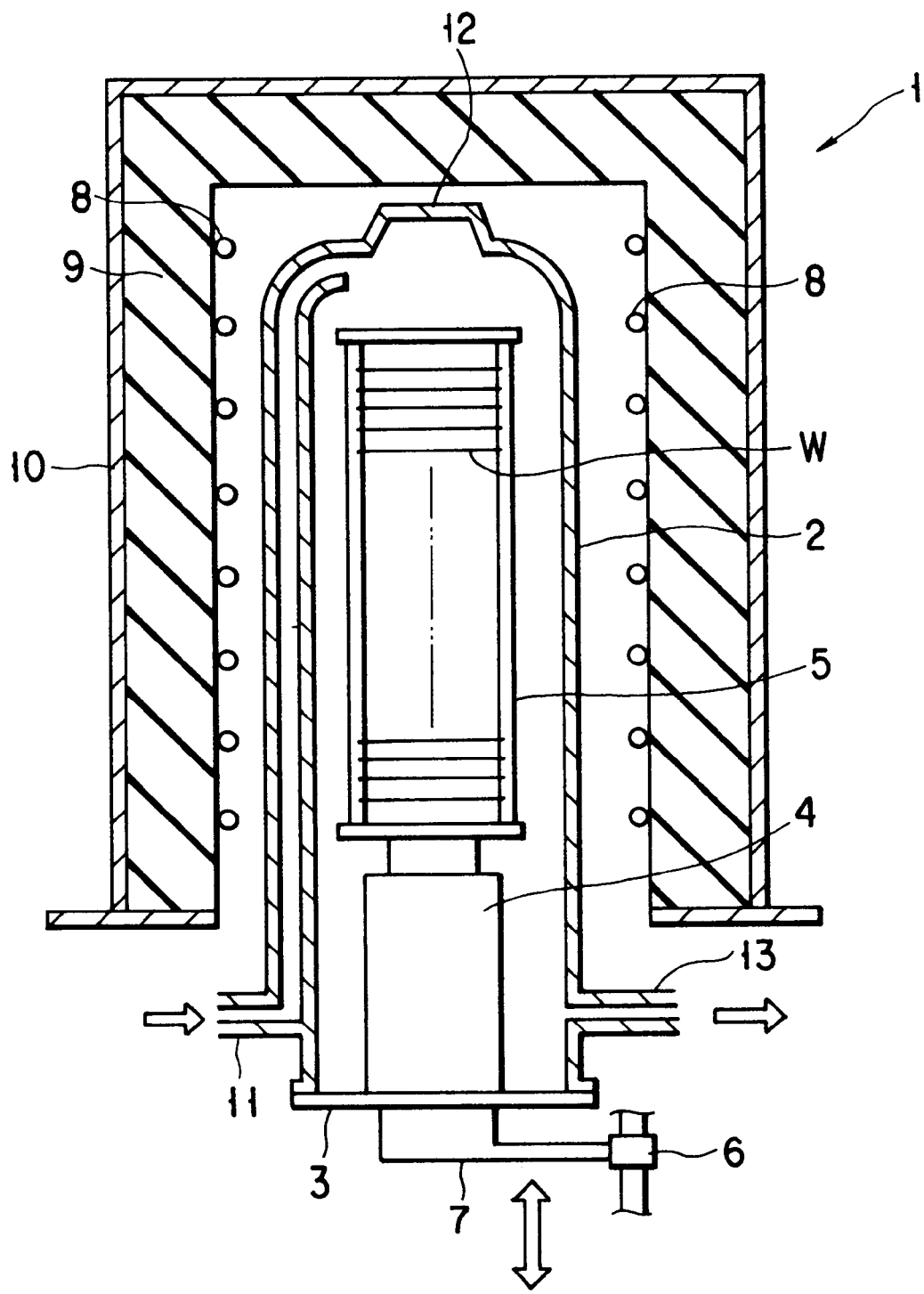
FIG. 1 is a sectional view showing an example of a vertical heat-treating apparatus.

A vertical heat-treating apparatus shown in FIG. 1 is formed to perform oxidation or diffusion for semiconductor wafers at a high temperature of, e.g., about 1,050° C.

An heat-treating apparatus 1 has a longitudinally cylindrical quartz processing chamber 2 having an open lower end. A lid 3 that opens and closes this lower-end opening portion is arranged under the processing chamber 2 to hermetically seal it. A wafer boat, i.e., a heat-treating boat 5, is placed on the lid 3 through a quartz heat-insulating cylinder 4. A large number of wafers W are horizontally supported in the boat 5 at a predetermined pitch in the vertical direction.

The lid 3 is connected to an elevating mechanism 6 such as a boat elevator through an arm 7 to load/unload the boat 5 in/from the processing chamber 2. Accordingly, when the boat 5 is moved vertically, the lid 3 is opened/closed simultaneously.

A heater 8 is arranged around the processing chamber 2 in a coiled manner to heat the interior of the processing chamber 2 to a desired temperature of about 800° C. to 1,100° C. The processing chamber 2 and heater 8 are entirely covered with, e.g., a stainless steel outer shell 10, through a heat-insulating material 9.

A gas inlet pipe 11 is integrally molded at one side portion in the lower portion of the processing chamber 2. The gas inlet pipe 11 is guided upward integrally with the pipe wall of the processing chamber 2 and opens in a gas inlet portion 12 formed in the upper portion in the processing chamber 2. The gas inlet pipe 11 supplies a process gas, e.g., water vapor when performing oxidation. An exhaust pipe 13 is integrally molded at the other side portion of the processing chamber 2. The exhaust pipe 13 is connected to a vacuum pump (not shown) or the like in order to maintain the interior of the processing chamber 2 at a desired pressure-reduced atmosphere.

Figure 2:
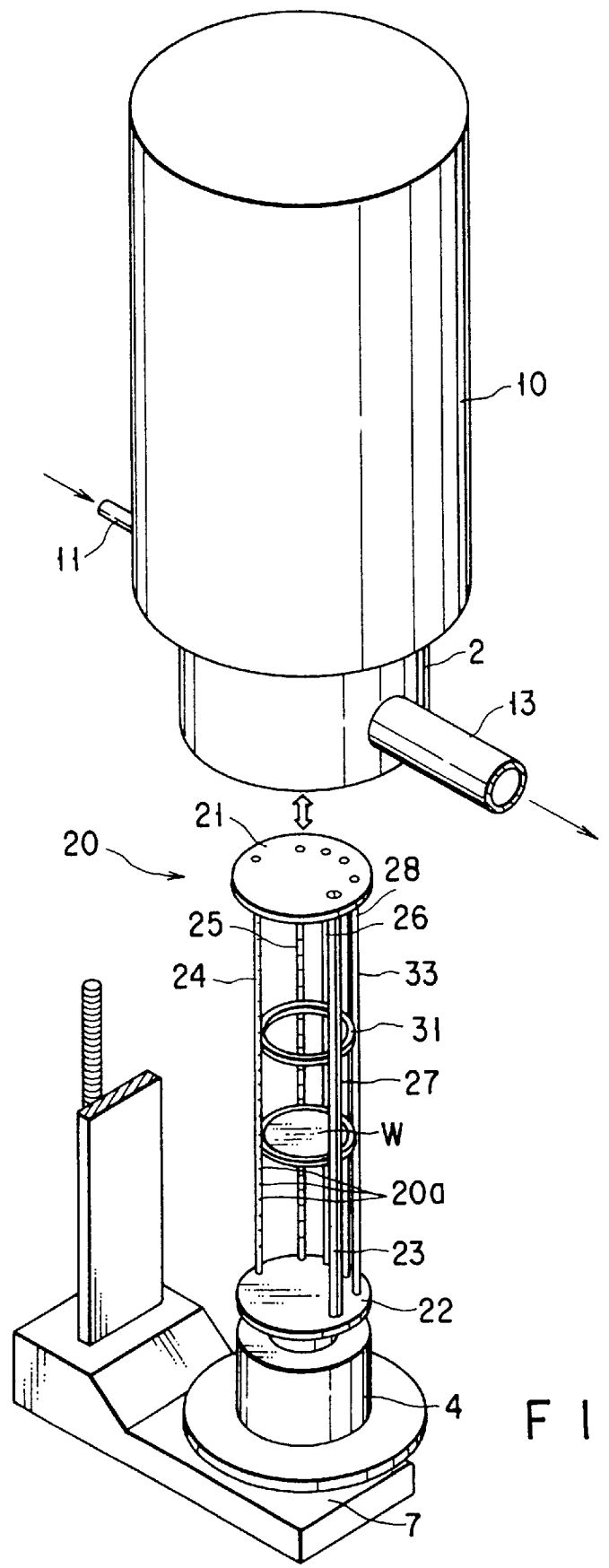
FIG. 2 is a perspective view showing a heat-treating boat according to an embodiment of the present invention, which is removed from a processing chamber.

FIG. 2 is a perspective view showing a heat-treating boat 20 according to an embodiment of the present invention, which is removed from the processing chamber 2.

The heat-treating boat 20 according to this embodiment forms a ring boat. The boat 20 has circular top and bottom plates 21 and 22 arranged to oppose each other in the vertical direction, and a plurality of columns, usually at least three columns, e.g., 6 columns 23 to 28, are fixed between the top plate 21 and bottom plate 22. For example, 63 ring trays 31 serving as ring support members are arranged between the top plate 21 and bottom plate 22 substantially horizontally at a predetermined gap, e.g., at a pitch of 11 mm. The top plate 21, the bottom plate 22, the columns 23 to 28, and the ring trays 31 are made of SiC so that they can ensure a high-temperature process performed at about 1,200° C.

The structure of the trays 31 and a structure for fixing the trays 31 to the columns will be descried with reference to FIGS. 3 to 7. In the following description, the side where the wafers are to be loaded or unloaded in or from the boat 20 is defined as the front side, and the side opposite to it is defined as the deep side.

One column 23 on the front side is formed to have an elliptic cross section, and the remaining columns 24 to 28 are formed to have true circular sections. Grooves 20a are formed in each of the columns 24 to 28 to perpendicularly intersect the axis of the corresponding column, such that they are arranged at gaps from each other in the longitudinal direction. Note that in FIG. 3 only one groove 20a is shown for the sake of illustrative convenience. The grooves 20a are used to accept the edges of the trays 31 when mounting the trays 31 on the columns 24 to 28, as shown in FIG. 3 and FIGS. 6 and 7.

Figure 6:
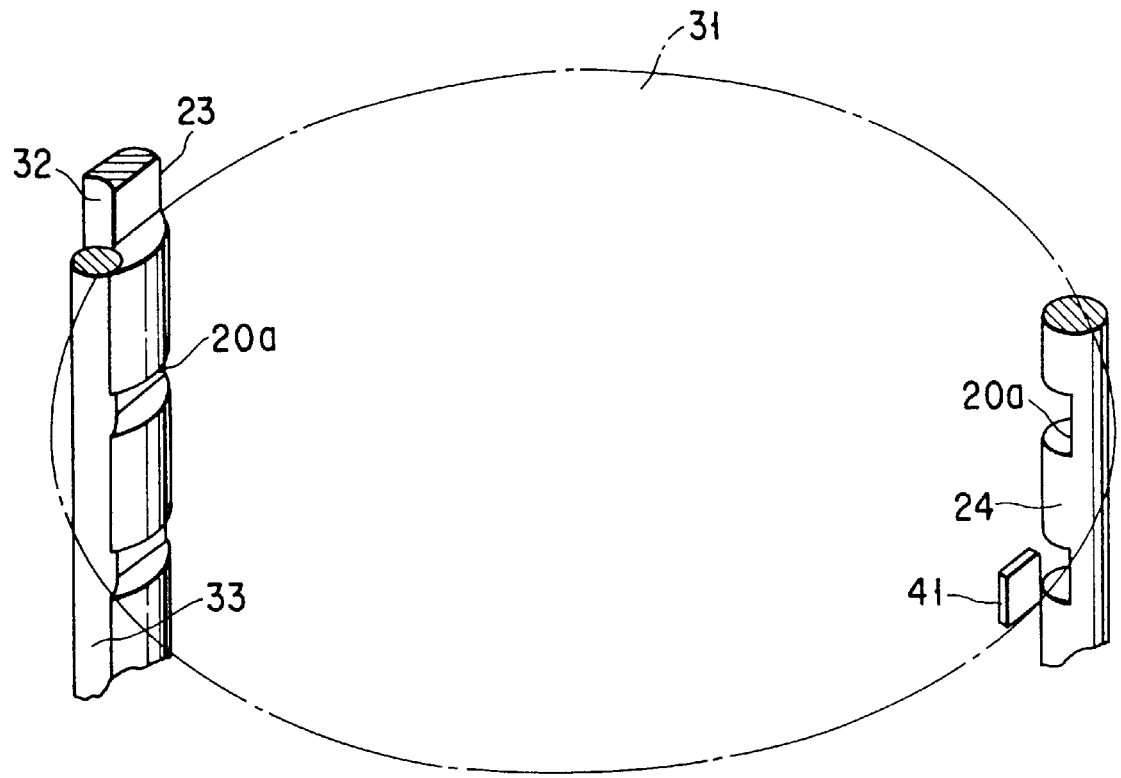
FIG. 6 is a perspective view showing the relationship among the tray, the columns, and the fixing rod of the boat shown in FIG. 2.
Figure 7:
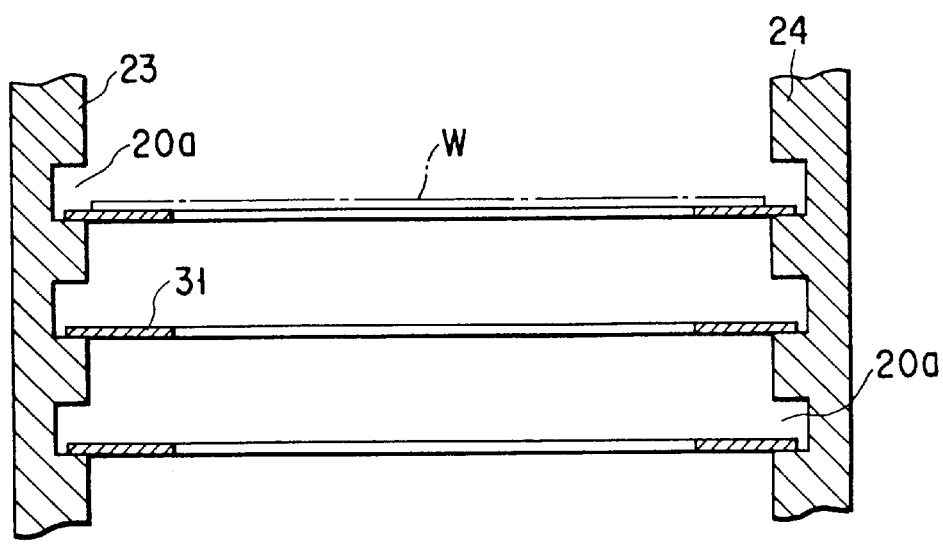
FIG. 7 is a cross-sectional view showing the relationship between the trays and the columns of the boat shown in FIG. 2.

A notch 32 is formed in one column 23 on the front side to extend from the upper end portion to the lower end portion of the column 23 (see FIG. 3 and FIGS. 6 and 7). A fixing rod 33 constituted by a round rod (to be described later) is to be inserted in the notch 32 from its upper end to its lower end. The inner circumferential surface of the notch 32 forms an arcuated cross section to match with the shape of the fixing rod 33.

As shown in FIG. 3, an insertion hole 21a where the upper end of the column 23 is to be inserted and fixed is formed in the top plate 21. An insertion recessed portion 22a where the lower end of the column 23 is to be inserted and fixed is formed in the bottom plate 22. The fixing rod 33 is inserted to extend from the hole 21a to the recessed portion 22a. The hole 21a and recessed portion 22a are formed such that the column 23 is inserted in them as the fixing rod 33 is engaged with the column 23. The top portion of the fixing rod 33 forms a large-diameter portion 33a. The operator can insert the fixing rod 33 between the top plate 21 and bottom plate 22 and remove it from between the top plate 21 and bottom plate 22 by holding the large-diameter portion 33a.

A notch 34, having an arcuated cross section to engage with part of the entire circumference of the fixing rod 33, is formed in the peripheral edge portion of the ring tray 31. A projection 41 is formed at a position on the peripheral edge portion of the tray 31 that substantially opposes the notch 34, to project upward from the upper surface of the tray 31. The height of the projection 41 is set such that, when the tray 31 is held in the grooves 20a of the columns 23 to 28, the projection 41 is higher than the upper ends of the grooves 20a.

Figure 8A:
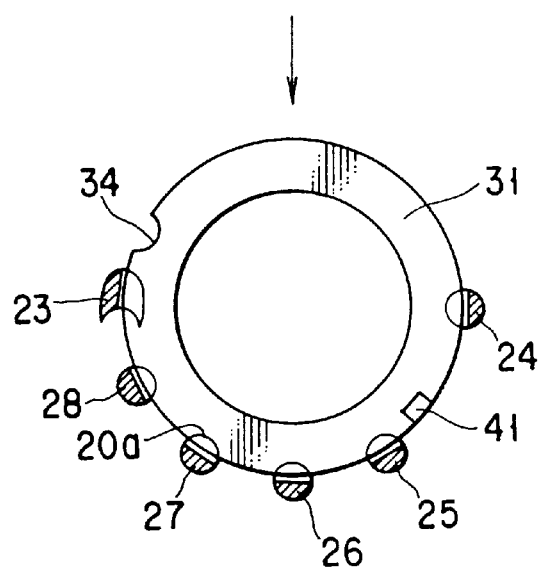
FIGS. 8A to 8C are views showing how to mount the tray shown in FIG. 4 in the boat.

The ring tray 31 is placed into a region surrounded by the columns 23 to 28 through a gap between the columns 23 and 24, such that its projection 41 is located inside the groove 20a of the column 24, as shown in FIG. 8A, at a height corresponding to the grooves 20a of the columns 23 to 28. The edge of the tray 31 is inserted in the grooves 20a, thereby mounting the tray 31 on the columns 23 to 28.

Figure 8B:
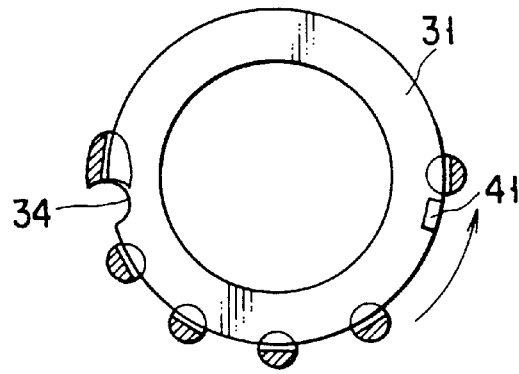

At this time, the tray 31 is rotated in the direction indicated by arrows in FIGS. 5 and 8B until the projection 41 abuts against the outer surface of the column above the groove 20a of the column 24. The notch 34 and projection 41 of the tray 31 are set to satisfy such a positional relationship that, when the notch 34 forms a fixing rod insertion area together with the notch 32 of the column 23, the projection 41 abuts against the column 24.

Figure 8C:
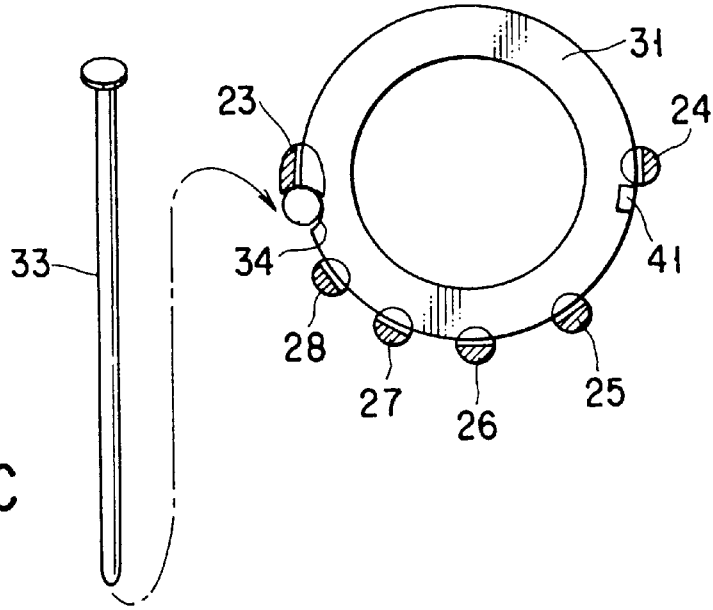

After all the trays 31 are arranged in the space between the columns 23 to 28, the fixing rod 33 is inserted through the hole 21a of the top plate 21, as shown in FIG. 8C, and is placed in the recessed portion 22a of the bottom plate 22 through a space surrounded by the notches 32 and 34. As a result, the respective trays 31 are indirectly locked by the column 23 through the fixing rod 33, and the projections 41 are locked by the column 24. In this case, although the fixing rod 33 and the notch 34 are in contact with each other, a gap is shown between them in FIG. 5 for the sake of convenience. When the projections 41 are locked by the column 24, the trays 31 are reliably prevented from dropping.

The heat-treating ring boat 20 is detachably mounted on the heat-insulating cylinder 4 as described above or as is shown in FIG. 2. The heat-insulating cylinder 4 is placed on the arm 7 of the boat elevator. The processing chamber 2 covered with the outer shell 10 is arranged above the heat-treating boat 20.

Wafer heat-treating performed with the vertical heat-treating apparatus by using the ring boat 20 will be briefly described.

In a region under the processing chamber 2, the wafers W are transferred to the boat 20. A push-up mechanism (not shown) vertically moves through the ring tray 31 to aid transfer of each wafer W. The wafer W on a transfer arm is placed on the tray 31 through the push-up mechanism.

This transfer of the wafers W is sequentially performed starting from, e.g., the upper-stage side of the boat 20. After a predetermined number of wafers, e.g., 63 wafers, are loaded in the boat 20, the wafer boat 20 is transferred onto the heat-insulating cylinder 4 on the elevator arm 7. Subsequently, the wafers W are loaded in the processing chamber 2 upon upward movement of the arm 7, and the wafers W are consecutively subjected to predetermined heat-treating.

With the heat-treating ring boat 20, the ring trays 31 can be easily fixed (drop-prevented) on the boat main body (the assembly constituted by the columns 23 to 28, the top plate 21, and the bottom plate 22) without performing welding. An heat-treating boat using a high-melting material, e.g., SiC, can therefore be put into practical use. If this structure is applied to a quartz heat-treating boat that can conventionally be welded, the flatness of the trays 31 can be more ensured than in a case where welding that causes some distortion in the trays 31 is performed. Therefore, with this heat-treating boat, heat-treating having a high planar uniformity can be performed.

The fixing rod 33 is fixed by fitting it in the notches 32 and 34 of the column 23 and ring trays 31, respectively. The trays 31 are accordingly fixed by the column 23 through the fixing rod 33, and their backlash is suppressed. Since the trays 31 can be removed by extracting the fixing rod 33 from the boat main body, the trays 31 can be cleaned easily.

In the ring boat 20, the notch 34 in the ring tray 31 serves as the fixing rod inserting portion. In place of this, a hole 42 forming a fixing rod inserting portion may be formed in a ring tray 31, as shown in FIG. 9A, and a fixing rod may be inserted in the hole 42 to prevent drop of the tray. In this case, although the tray 31 is not locked by a column 23, the drop preventive effect can be obtained.

As shown in FIG. 9B, notches 34a and 34b may be formed at two opposing portions in the peripheral edge portion of a ring tray 31, and a notch similar to the notch 32 may be formed in a column 24, to fix the tray 31 on a column 23 and the column 24 at its two portions respectively through fixing rods 33.

Furthermore, in place of the ring tray 31, a circular disk tray 36 having a notch 34 for allowing a transfer arm to pass may be used, as shown in FIG. 10.

Concerning the locking structure for the fixing rod 33 and bottom plate 22, instead of merely fitting the fixing rod 33 in the recessed portion 22a, as described above, the fixing rod 33 may be locked by threadable engagement. FIG. 11 shows a heat-treating ring boat 50 according to another embodiment of the present invention which is based on this viewpoint.

Figure 12:
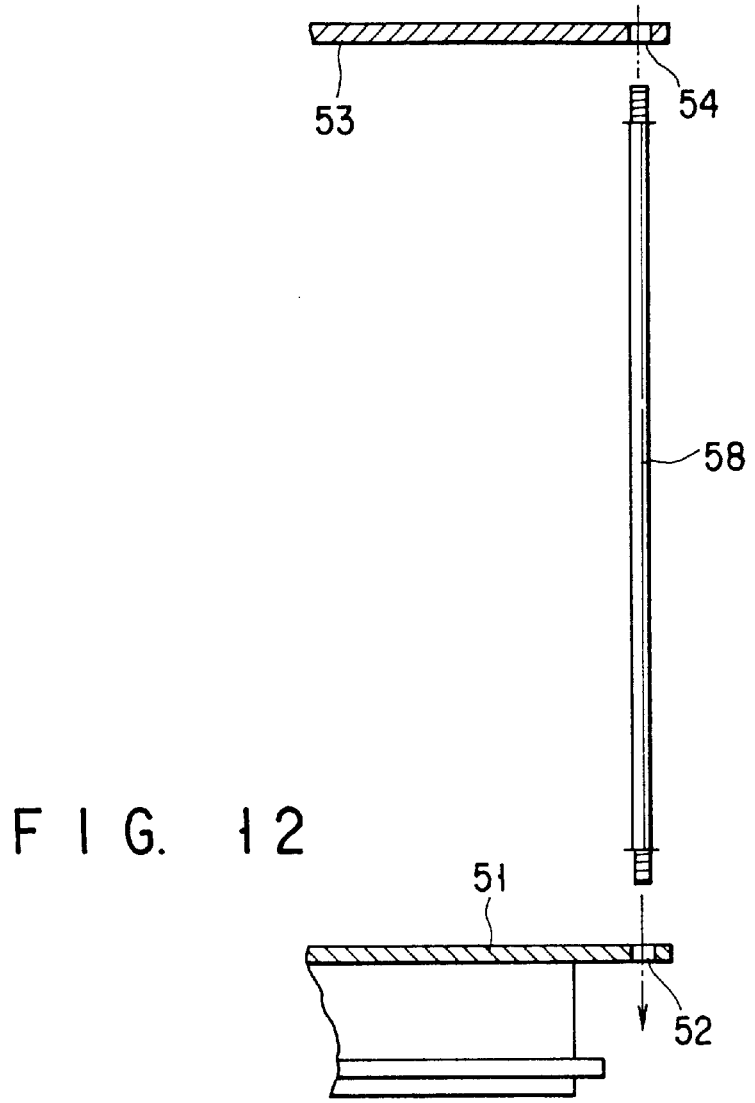
FIG. 12 is an exploded side view showing part of the boat shown in FIG. 11.

In this embodiment, as shown in FIG. 12, four screw holes 52 are formed in a bottom plate 51, and the lower end portions of fixing rods 58 are threadably engaged in the respective screw holes 52. The planar positional relationship among the six fixing rods 58 is substantially identical to the positional relationship among the columns 23 to 28 of the embodiment described above.

Figure 13:
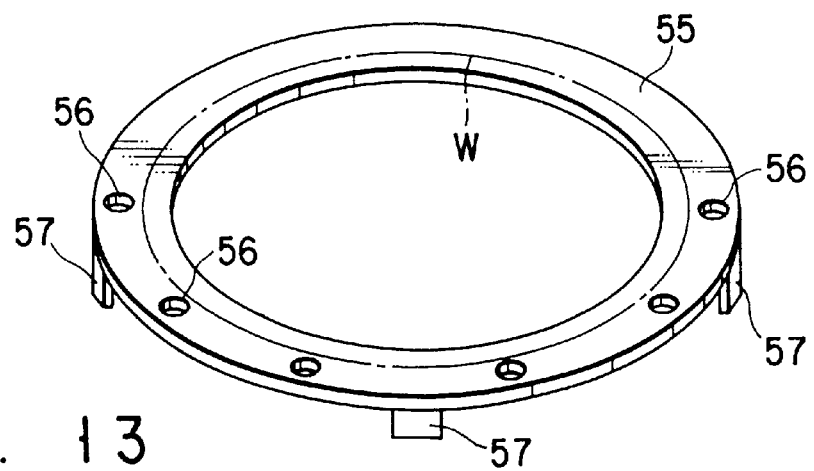
FIG. 13 is a perspective view showing the tray of the boat shown in FIG. 11.

Holes 56 forming inserting portions for the fixing rods 58 are formed at six portions in each ring tray 55, as shown in FIG. 13. Projections 57 are formed on the lower surface side of the peripheral edge portion of each tray 55 at the deep-side central portion and the right and left sides, i.e., at a total of three portions. The projections 57 serve to ensure the vertical arrangement pitch of the trays 55. Concerning the right and left projections 57, if they are not located on the front side of the diameter that connects the right and left sides, the tray 55 will fall forward. If the projections 57 are excessively close to the front side, a wafer cannot be transferred to it. From these reasons, the projections 57 are formed at positions determined by considering these respects.

The trays 55 are sequentially stacked at a predetermined pitch through the fixing rods 58. In other words, the lower surfaces of the projections 57 of an upper-stage tray are supported on the upper surface of a lower-stage tray 55.

After a necessary number of trays 55 are stacked, the upper end portions of the fixing rods 58 are inserted in insertion holes 54 of a top plate 53. Then, nuts are threadably engaged with the threaded portions at the upper end portions of the fixing rods 58 and are fastened. The heat-treating ring boat 50 is assembled in this manner.

Also in the ring boat 50 according to this embodiment, the trays 55 can be easily fixed (drop-prevented) on the boat main body to obtain the effect described above. The projections 57 that determine the pitch of the trays 55 may be formed on the upper surfaces of the trays 55. In this case, concerning the lowermost-stage tray 55, projections may be formed on its upper and lower surfaces. The fixing rod inserting portions are not limited to holes, but can be notches formed in the peripheral edge portions of the ring trays.

Figure 14:
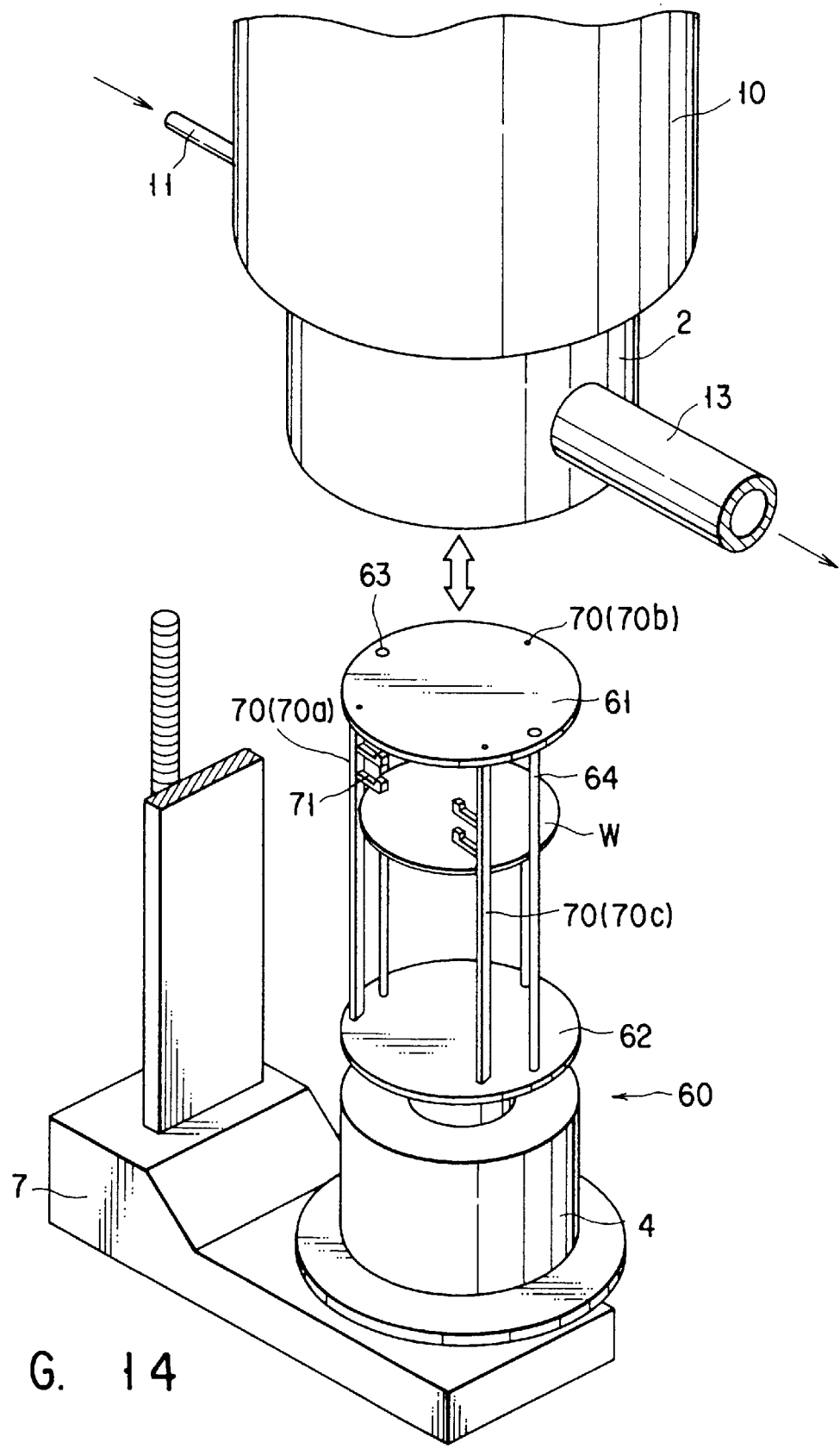
FIG. 14 is a perspective view showing a heat-treating boat according to still another embodiment of the present invention, which is removed from a processing chamber.

FIG. 14 is a perspective view showing a heat-treating boat 60 according to still another embodiment of the present invention, which is removed from a processing chamber 2.

The heat-treating boat 60 has circular top and bottom plates 61 and 62, and a plurality of connection rods, e.g., two connection rods 63 and 64, extending between the top plate 61 and bottom plate 62. The top plate 61, the bottom plate 62, and the connection rods 63 and 64 are made of quartz and are connected to each other by welding. The number of connection rods 63 and 64 is not limited to two, but may be three, four, or more.

Figure 15:
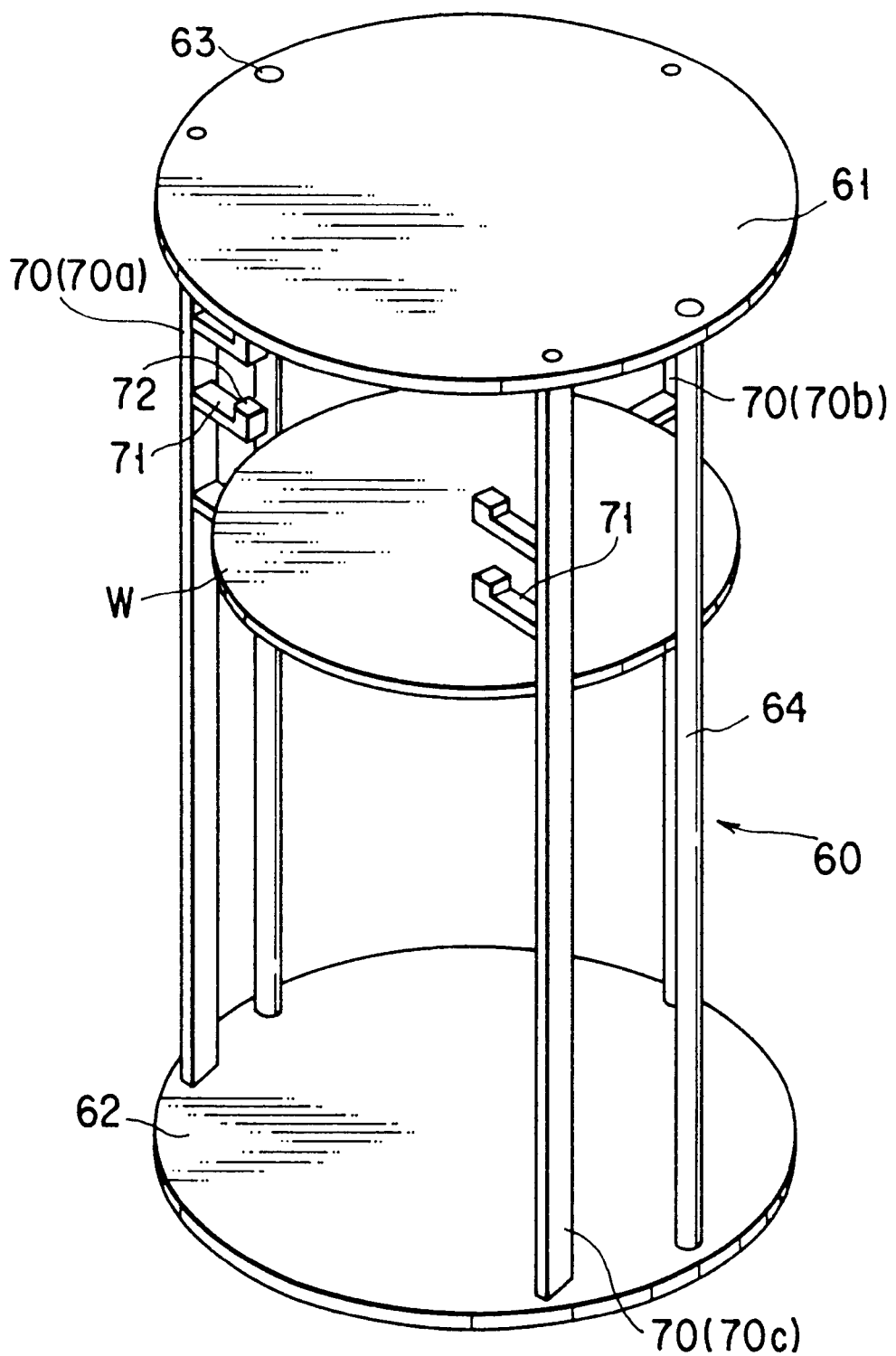
FIG. 15 is a perspective view showing the boat shown in FIG. 14.

A plurality of columns, e.g., 3 columns 70 (70a to 70c), are detachably mounted between the top plate 61 and bottom plate 62. As shown in FIGS. 15 to 17, beams 71 equal in number to the number of wafers W to be held, e.g., 100 beams 71, extending inward substantially horizontally are formed on each column 70 at predetermined gaps in the vertical direction, e.g., at a pitch of 10 mm. The distal end side of each beam 71 projects upward, and the upper surface of this distal end side serves as a wafer support portion 72. The support portion 72 can be formed as, e.g., a mirror-finished or smooth-finished horizontal or spherical surface.

In the boat according to this embodiment for processing 12-inch wafers, as shown in FIG. 16, each beam 71 is formed to have a length L1 of 70 mm and a support portion length L2 of 20 mm such that the support portion 72 projects upward for about 2 mm. These values are determined by considering suppression of slip as a crystal defect occurring in the wafers W during heat-treating and easy transfer operation of the wafers W with respect to the boat 60.

Comprehensively, each support portion 72 is formed such that its innermost end position CP that comes into contact with the lower surface of the wafer W is located within a range of 0.6 D to 0.95 D, and preferably a range of 0.7 D to 0.9 D, on the lower surface of the wafer W where D is the diameter of the wafer W which is substantially circular. In other words, the innermost end position CP is set to be present between a 0.6 D circle and a 0.95 D circle, and preferably between a 0.7 D circle and a 0.9 D circle, which are coaxial with the circular outline of the wafer W.

Each column 70 is constituted by, e.g., a 0.5-mm thick hollow body made of silicon carbide (SiC). For example, this hollow body is formed by forming an SiC film on the surface of a carbon rod by CVD, forming a hole in the column 70, and heating the column 70 to scatter carbon in it.

Insertion holes 61a where the upper ends of the columns 70 are inserted and fixed are formed in the top plate 61. Insertion recessed portions 62a where the lower ends of the columns 70 are inserted and fixed are formed in the bottom plate 62. Projections 73 each having a shape to fit in the corresponding insertion hole 61a are formed on the upper ends of the columns 70, as shown in, e.g., FIG. 17. The lower ends of the columns 70 are fitted in the recessed portions 62a, and the upper end-side projections 73 on the columns 70 are inserted in the insertion holes 61a, so that the columns 70 are connected to the top plate 61 and bottom plate 62.

Fixing members 74 for preventing horizontal swing or the like of the columns 70 are arranged on the bottom plate 62. Each fixing member 74 is formed to support, e.g., the two side portions of the lowermost-stage support portion 72 of the corresponding column 70.

Figure 18:
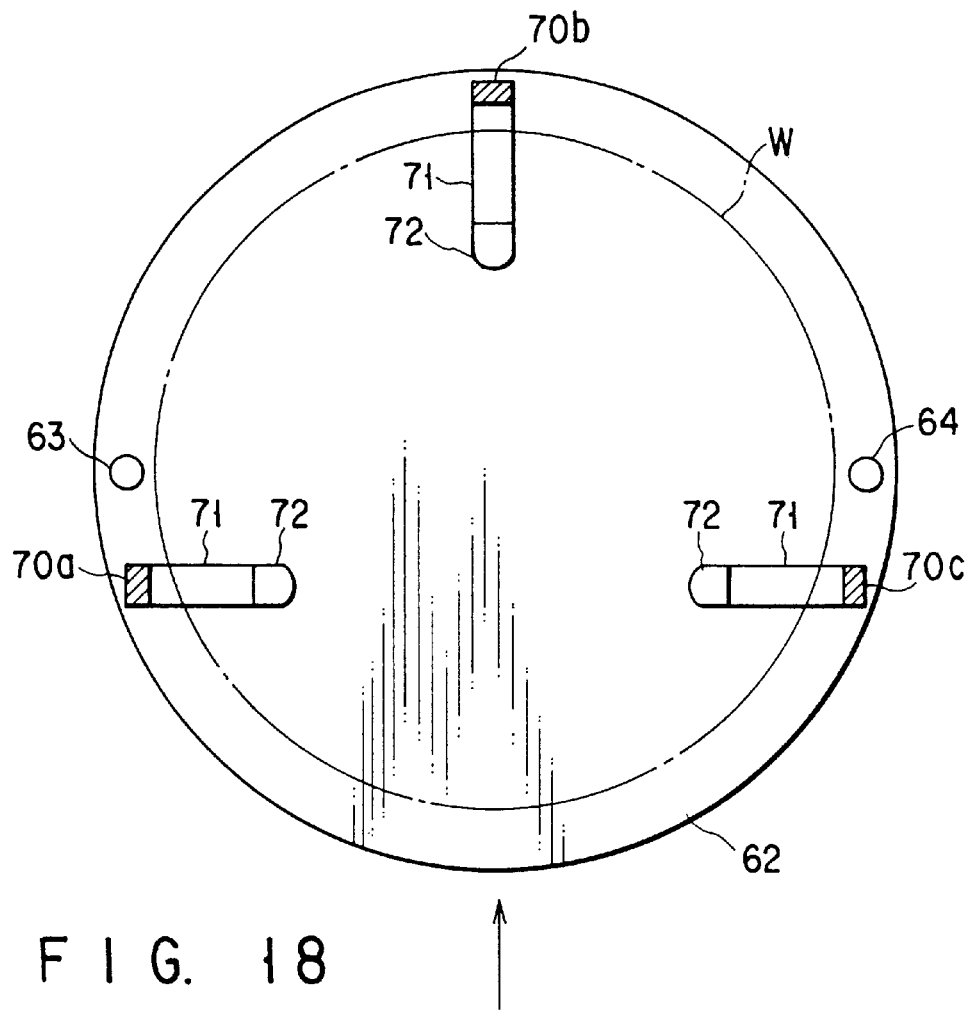
FIG. 18 is a cross-sectional side view showing the boat shown in FIG. 14.

The fixing and mounting positions of the connection rods 63 and 64 and of the columns 70a to 70c will be described with reference to FIG. 18. In FIG. 18, a one-dot chain line indicates a place where the wafer W is to be placed.

For example, the connection rods 63 and 64 are fixed at positions on the diameter of the bottom plate 62 and on the left and right positions of the wafer W. The two columns 70a and 70c of the columns 70 are mounted at the left and right positions, respectively, in the front side than the connection rods 63 and 64 with respect to the entering direction of the wafer W indicated by the arrow in FIG. 18, such that they are located outside the circumferential edge of the wafer W when the wafer W enters. The remaining column 70b of the columns 70 is mounted at the position on the deeper side of the wafer W which is behind the connection rods 63 and 64.

The columns 70a to 70c are mounted such that the respective support portions 72 are located at positions inside the circumferential edge portion of the wafer W that equally divide the wafer W into three portions in the angular direction. Hence, for example, the left and right columns 70a and 70c are mounted such that their beams 71 extend inward from the column mounting positions in a direction perpendicular to the entering direction of the wafer W. The column 70b on the deep side is mounted such that its beams 71 extend inward from the column mounting position in a direction opposite to the entering direction of the wafer W.

The heat-treating ring boat 60 is detachably mounted on a heat-insulating cylinder 4 as described above or as is shown in FIG. 14. The heat-insulating cylinder 4 is placed on an arm 7 of a boat elevator. The processing chamber 2 covered with an outer shell 10 is arranged above the heat-treating boat 60.

Wafer heat-treating performed with the vertical heat-treating apparatus by using the heat-treating boat 60 will be briefly described.

Figure 19:
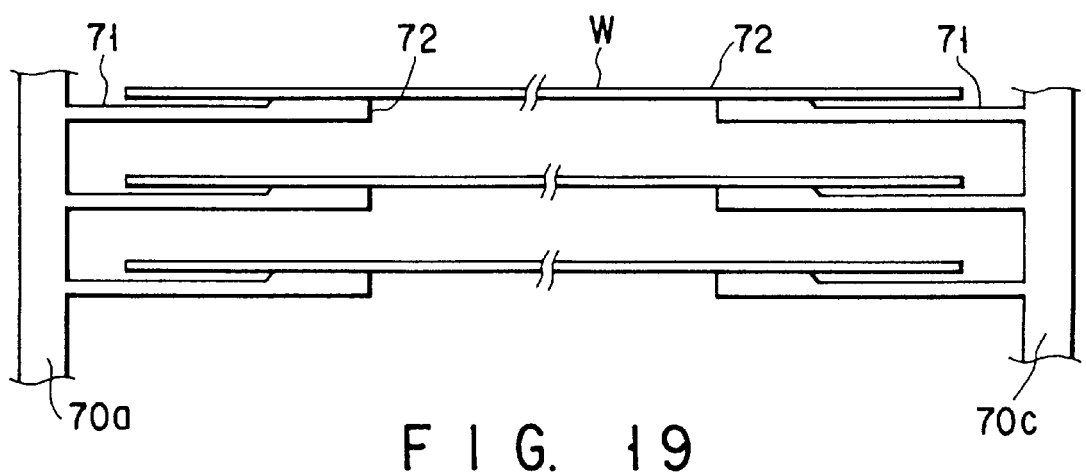
FIG. 19 is a side view showing the relationship between the columns and wafers of the boat shown in FIG. 14.

In a region under the processing chamber 2, the wafers W are transferred to the boat 60. Each wafer W is fed by a transfer arm (not shown) through a gap between the columns 70a and 70c. As shown in FIG. 19, the wafer W is placed on the support portions 72 on the columns 70a to 70c.

This transfer of the wafers W is sequentially performed starting from, e.g., the upper-stage side of the boat 60. After a predetermined number of wafers, e.g., 100 wafers, are loaded in the boat 60, the wafer boat 60 is transferred onto the heat-insulating cylinder 4 on the elevator arm 7. Subsequently, the wafers W are loaded in the processing chamber 2 upon upward movement of the arm 7, and the wafers W are consecutively subjected to predetermined heat-treating.

With the heat-treating boat 60, each wafer W is supported by the support portions 72 at positions that equally divide into three portions a region inside the outer circumferential edge portion of the wafer W in the angular direction, as shown in FIG. 19. Each support portion 72 is formed such that its innermost end position CP that comes into contact with the lower surface of the wafer W is located within a range of 0.6 D to 0.95 D, and preferably a range of 0.7 D to 0.9 D, on the lower surface of the wafer W where D is the diameter of the wafer W which is substantially circular.

For this reason, the moment generated at each supported portion by the weight of the wafer W itself becomes smaller than in a case wherein the wafer W is supported at its outer peripheral edge portion, and the stress that acts on the wafer at each supported portion decreases. In addition, since the wafer W is supported at positions that equally divides the W into three portions in the angular direction, the stress is not concentrated at one portion of the wafer W, and the occurrence of slip can be suppressed.

In this manner, if the wafer W is supported at three points, it can be supported uniformly, which is advantageous. Four or more columns 70 may be arranged and the wafer W may be supported at four or more points.

The columns 70 are manufactured separately of the top plate 61 and bottom plate 62 and are mounted on them afterwards. This facilitates the manufacture and decreases the manufacturing cost. More specifically, when the columns 70 are formed integrally with the other members of the boat 60, if machining of the beams 71 fails, this boat can no longer be used. When fixing the columns 70 to the top plate 61 or the like by welding or the like, the directions of the beams 71 fluctuate and height precision cannot sometimes be obtained in the support portions 72.

In contrast to this, when the columns 70 are manufactured separately, even if machining of the beams 71 fails, merely the columns 70 must be fabricated again. Regarding mounting of the columns 70, it suffices by only fitting the lower ends of the like of the columns 70 in the recessed portions 62a or the like formed in the beams 71 or the like. Hence, height precision of the support portions 72 can be ensured. Since the columns 70 are manufactured separately of the other members of the boat 60, even columns with complicated structures, e.g., the columns having beams 71 of this embodiment, which are difficult to form integrally, can be manufactured easily.

Since the load of the wafers W does not act on the quartz connection rods 63 and 64, even if the process is performed at such a high temperature, e.g., 1,050° C., that may deform the columns if the heat-treating boat is entirely made of quartz, the boat 60 will not deform by the high temperature or not be broken by the thermal stress. In contrast to this, although the load of the wafers W acts on the columns 70a and 70b, since the columns 70a and 70b are made of SiC, they will not deform by the high temperature.

The two ends of each of the columns 70a and 70b are detachably fitted in the top plate 61 and bottom plate 62, and the connection rods 63 and 64 serve to support the top plate 61. Therefore, no cracking may occur by the difference in thermal expansion between the columns 70a and 70b and the boat main body 60.

Furthermore, since the columns 70 are constituted by SiC hollow bodies, the thermal capacity of the columns 70 can be decreased. The surface temperature of the wafers W well follows the temperature change of the heater, so that the convergence time until the processing temperature during heat-treating can be shortened. Since the difference in rate of temperature rise/fall between the supported portions of the wafers W and the other portions becomes small, the thermal stress is decreased. Also, the adverse influence of the stress caused by the weight of the wafer itself is suppressed. As a result, the occurrence of the slip can further be suppressed.

Since the columns 70 are constituted by the hollow bodies, they can be made lightweight, thereby decreasing the entire weight of the heat-treating boat 60. These hollow bodies can be formed easily, and allow formation of a structure having a complicated shape. Note that the columns 70 can also be constituted by solid bodies.

The columns 70 can also be made of polysilicon. Polysilicon is inexpensive and has a softening point higher than that of quartz but lower than that of SiC. When performing high-temperature heat-treating, only the columns 70 may be made of SiC while the other portions of the boat main body may be made of polysilicon.

When the processing temperature in heat-treating is comparatively low, the entire portion of the boat 60 can be made of quartz. When the processing temperature in heat-treating is rather high, the entire portion of the boat 60 can be made of SiC.

Figure 35:
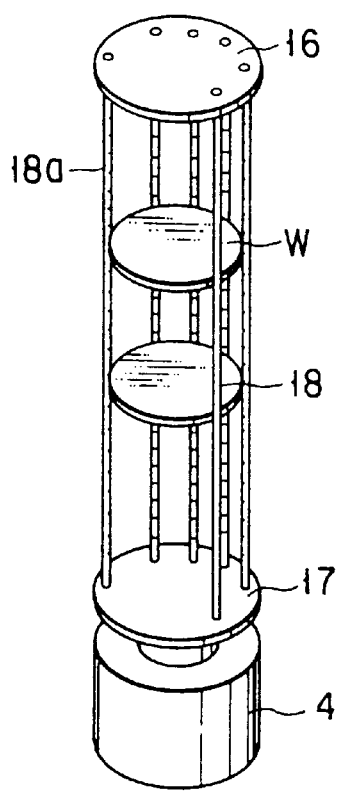
FIG. 35 is a perspective view showing a conventional heat-treating ladder boat.

The columns 70 can further be formed with grooves, used in a ladder boat (see FIG. 35), where the peripheral edge portions of the wafers W are to be inserted.

Figure 20A:
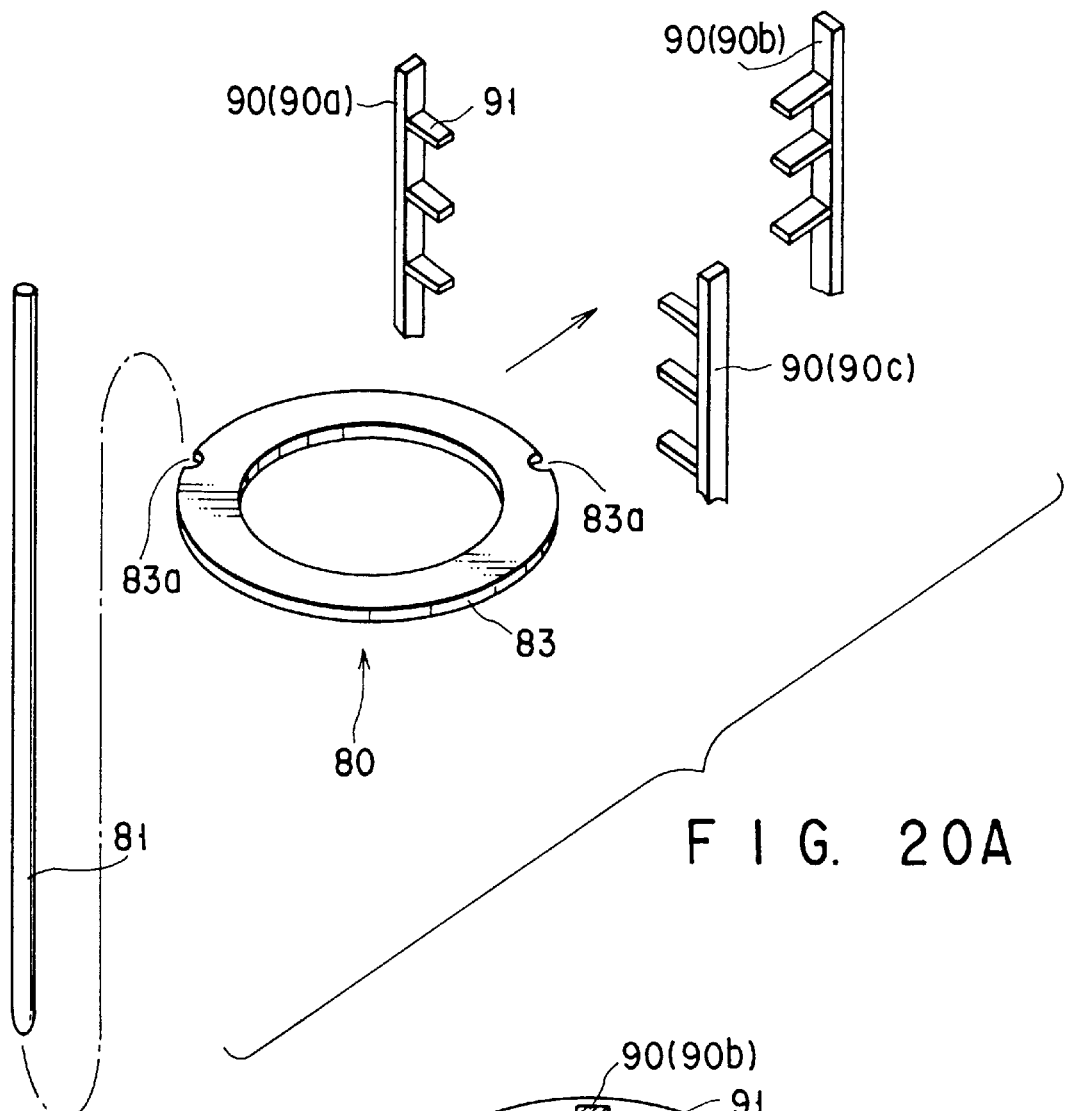
FIGS. 20A and 20B are a partially exploded perspective view and a cross-sectional plan view, respectively, showing a heat-treating boat according to still another embodiment of the present invention.
Figure 20B:
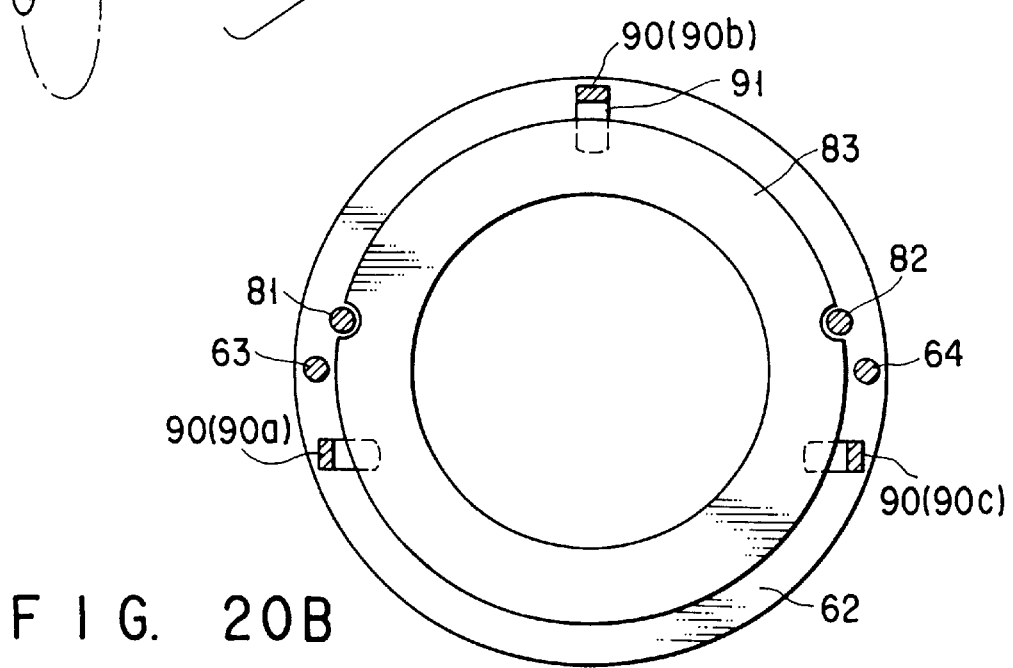
Figure 36:
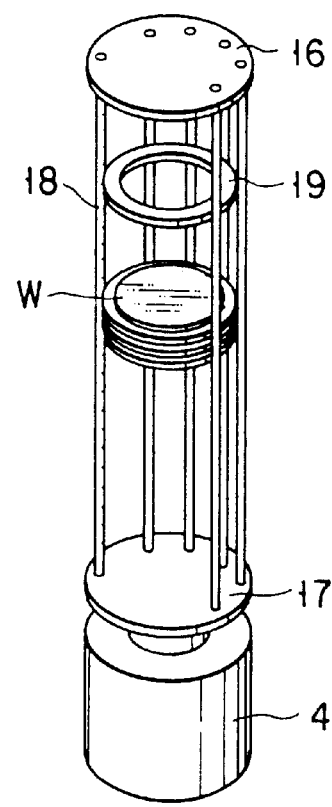
FIG. 36 is a perspective view showing a conventional heat-treating ring boat.

The beams 71 of the columns 70 can be utilized also for forming a ring boat (see FIG. 36). FIGS. 20A and 20B are views showing the main part of a heat-treating boat according to still another embodiment of the present invention on the basis of this viewpoint.

This ring boat 80 has a plurality of ring trays 83, as shown in FIG. 20A, for forming horizontal support levels where wafers are to be placed. The peripheral edge portions of the trays 83 are supported by beams 91 of columns 90 (90a to 90c) (see FIG. 20B).

Notches 83a are formed at, e.g., two portions in the peripheral edge portion of each tray 83. Fixing rods 81 and 82 to match the notches 83a are inserted to extend from a top plate 61 to a bottom plate 62 to fix the trays 83.

In the ring boat 80, the trays 83, the columns 90, and the fixing rods 81 and 82 can be made of SiC, and the top plate 61, the bottom plate 62, and connection rods 63 and 64 can be made of quartz.

Figure 21:
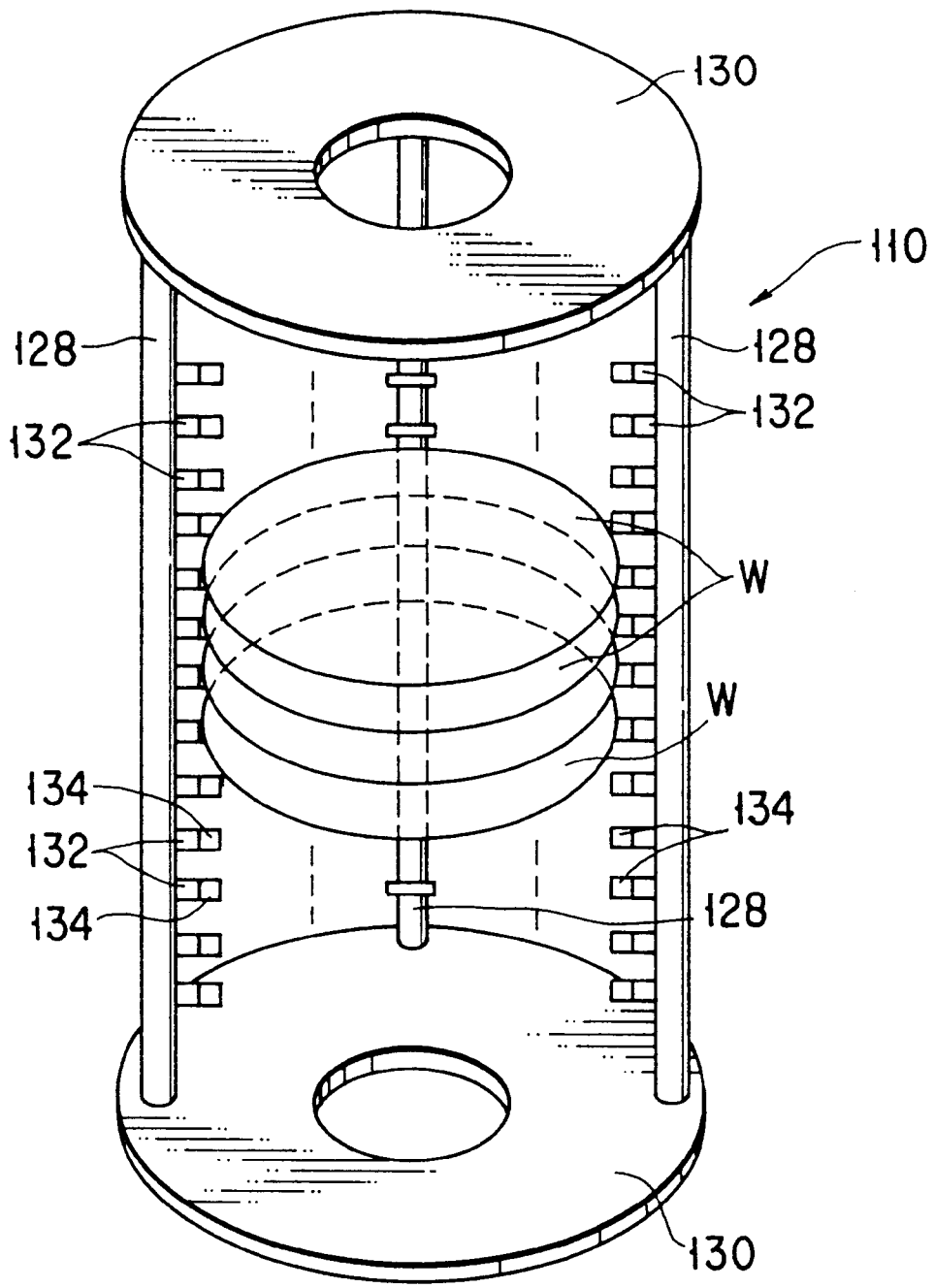
FIG. 21 is a perspective view showing a heat-treating boat according to still another embodiment of the present invention.

FIG. 21 is a perspective view showing a heat-treating boat 110 according to still another embodiment of the present invention.

As shown in FIG. 21, the boat 110 has three columns 128 made of, e.g., quartz. The two ends of each column 128 are fixed by ring fixing plates 130 that are also made of quartz. The three columns 128 are arranged equidistantly on the substantially semicircular arcuated portions of the fixing plates 130 so that substantially circular wafers W can be loaded in and unloaded from the boat 110 in one direction with respect to the columns 128.

A large number of beams, e.g., 100 beams 132, each having a rectangular section are formed on each of the three columns 128 at a predetermined pitch in the lengthwise direction. Each beam 132 is directed toward the center of the boat. When processing 12-inch wafers, a pitch L11, a thickness L12, a width L13, and a length L14 of the beams 132 are set to, e.g., about 10 mm, about 3 mm, about 15 mm, and about 20 mm, respectively. Note that these values can be changed arbitrarily.

Figure 22:
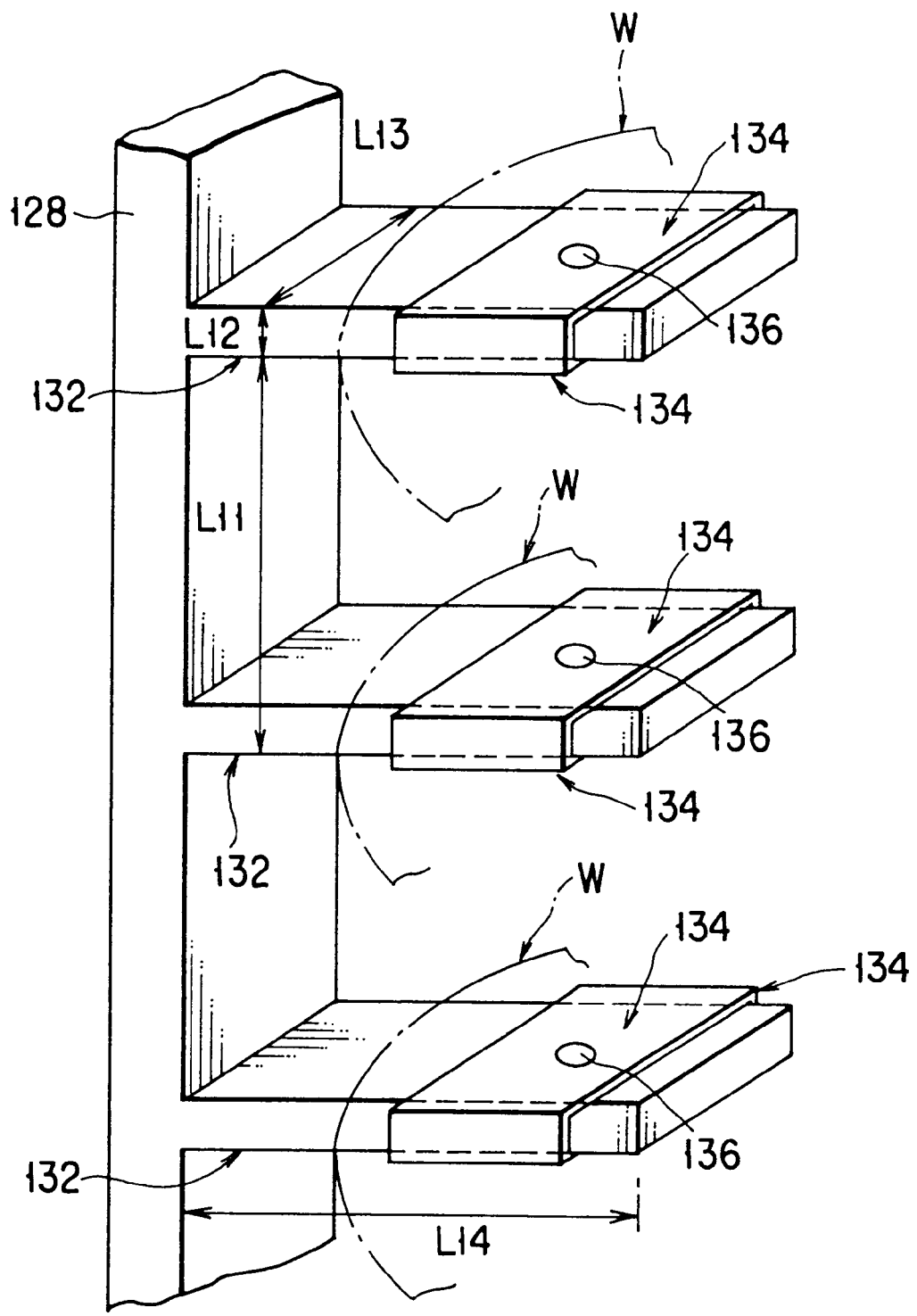
FIG. 22 is an enlarged perspective view showing part of a column and swing elements having wafer support surfaces of the boat shown in FIG. 21.
Figure 23:
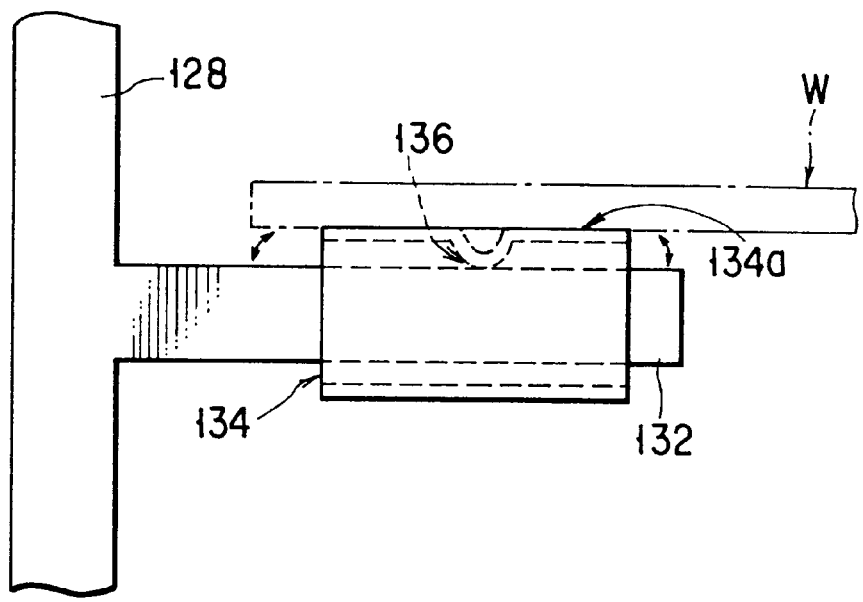
FIG. 23 is a side view showing the relationship among the column, the swing element, and the wafer of the boat shown in FIG. 21.
Figure 24:
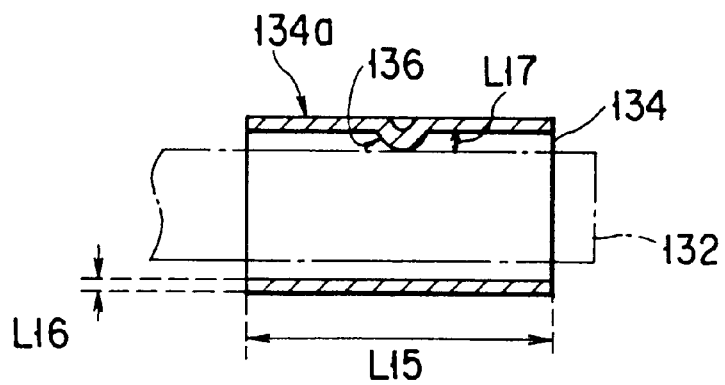
FIG. 24 is a sectional view showing the swing element shown in FIG. 22.

Each beam 132 is provided with a swing element 134 that can pivot and swing. More specifically, as shown in FIGS. 22 to 24, the swing element 134 is constituted by a hollow cylindrical body having a rectangular section and two open ends. The swing element 134 has a section slightly larger than that of the beam 132 and is loosely fitted on the beam 132.

A substantially hemispherical pivot projection 136 slightly projecting downward is formed at substantially the central portion of a support surface 134a as the upper surface of each swing element 134. When the distal end of the projection 136 comes into point contact with the upper surface of the beam 132, the swing element 134 can pivot and swing within a small distance about the projection 136 as the center. The wafer W is supported as its lower surface is directly placed on the support surfaces 134a of the swing elements 134.

The swing elements 134 are made of, e.g., SiC (silicon carbide), having substantially the same hardness as that of a metal. As shown in FIG. 24, a length L15 and a thickness L16 of the swing elements 134 are set to about 15 mm and about 0.5 mm, respectively, and a height L17 of the projections 136 is set to about 0.2 mm. The swing element 134 can pivot and swing like a see-saw with an angle corresponding to the height of a maximum of 2 mm at its two ends.

The swing element 134 can be easily formed by, e.g., coating the entire surface of a rectangular parallelepiped carbon block whose portion corresponding to the pivot projection 136 is formed into a recessed portion, with SiC to a thickness of about 0.5 mm, cutting the two ends of the SiC-coated carbon block, and evaporating the internal carbon block by oxidizing it at a high temperature. In this case, the support surface 134a on the surface of the swing element 134 is mirror-finished to improve the flatness. The recessed portion in the central portion of the support surface 134a is formed inevitably when forming the projection 136 by SiC coating, as described above. Since the area of this recessed portion is very small, it does not adversely affect the lower surface of the wafer.

Wafer heat-treating performed with the vertical heat-treating apparatus by using the heat-treating boat 110 will be briefly described.

In a region under a processing chamber 2, the wafers W are transferred to the boat 110. Each wafer W is transferred by a transfer arm (not shown) such that its lower surface comes into direct contact with the corresponding swing elements 134.

This transfer of the wafers W is sequentially performed starting from, e.g., the upper-stage side of the boat 110. After a predetermined number of wafers, e.g., 100 wafers, are loaded in the boat 110, the wafer boat 110 is transferred onto a heat-insulating cylinder 4 on an elevator arm 7 (see FIG. 1). Subsequently, the wafers W are loaded in the processing chamber 2 upon upward movement of the arm 7.

The wafers W are heated to and maintained at a predetermined process temperature, e.g., about 1,050° C., by a heater 8, and simultaneously a process gas is supplied into the processing chamber 2. For example, when performing oxidation, water vapor is introduced as the process gas, and oxidation is performed while a predetermined process pressure is maintained.

During heat-treating, a thermal stress is applied to the wafers W maintained at the high temperature. Even when the wafers W deform, however, since the swing elements 134 swing through point contact, the support surfaces 134a are always maintained to be horizontal to the lower surfaces of the wafers W, as shown in FIGS. 25A and 25B. In FIGS. 25A and 25B, the angle of inclination of the wafer W is exaggerated to facilitate understanding of the function of the present invention.

As a result, even if the wafers W slightly deform by the thermal stress or the like, the swing elements 134 pivot and swing to absorb this deformation amount. Therefore, the support surfaces 134a can accept the lower surfaces of the wafers not through point contact but through substantially complete surface contact.

This reduces the contact surface pressure. Even when the weight of the wafer itself increases, the contact surface pressure does not increase, and occurrence of slip or a crystal defect can be suppressed.

Since the support surfaces 134a can accept the lower surfaces of the wafers not through point contact but through surface contact constantly, as described above, the lower surface of the wafer will not be damaged by, e.g., a corner portion of the swing element 134, to cause slip, and the occurrence of slip or a crystal defect can be suppressed.

Since the pivot and swing projections 136 are formed on the swing elements 134, the swing elements 134 can pivot and swing regardless of where they are mounted, and can accordingly be mounted easily.

In the boat 110, the pivot and swing projection 136 is formed on the swing element 134 side. As shown in FIG. 26, a projection 136 may be formed on the upper surface side of a beam 132.

When a structure is employed in which a hollow swing element 134 is supported by merely inserting a beam 132 in it, the swing element 134 may sometimes drop easily. In order to prevent drop of the swing element, a drop preventive mechanism 138 may be provided, as shown in FIGS. 27 and 28.

FIG. 27 is a plan view showing a state wherein a swing element 142 employing the drop preventive mechanism 138 is mounted on a beam 132, and FIG. 28 is a view showing how to mount the swing element 142.

The drop preventive mechanism 138 has a locking portion 139 formed on the distal end of the beam 132 to extend for a small length, e.g., about several mm, in the widthwise direction. The swing element 142 has a cylindrical shape formed by mating first and second rectangular portions 143 and 144 eccentrically. In the swing element 142, no partition exists between the first and second portions 143 and 144. A step portion 145 is formed on the outer side surface of the swing element 142. The second portion 144 of the swing element 142 and the locking portion 139 operate together to constitute the drop preventive mechanism 138.

The first portion 143 of the swing element 142 has substantially the same size as that of the swing element 134 shown in FIG. 24. As shown in FIG. 28, the second portion 144 of the swing element 142 is set to have such a size that the distal end of the beam 132, including the locking portion 139, can be inserted in it by the minimum amount when the first portion 143 is inclined. A width L18 of the first portion 143 is set to be smaller than a width L19 of the beam 132 including the locking portion 139 and is larger than a width L20 of the beam 132 not including the locking portion 139.

When mounting, the swing element 142 is inclined, and the distal end of the beam 132 is completely inserted in it, as shown in FIG. 28. In this state, the swing element 142 is slightly moved in the widthwise direction of the beam 132 in a direction opposite to the locking portion 139. Thereafter, the swing element 142 is restored to the horizontal state. The swing element 142 is mounted on the beam 132 in this manner.

The arrow shown in FIG. 27 indicates the motion of the swing element 142 during mounting. When the swing element 142 is mounted in this manner, the motion of the swing element 142 in the widthwise direction is regulated by the width of the beams 132. Therefore, the swing element 142 interferes with the locking portion 139 to prevent it from dropping.

The wafer support structure using the swing element 134 or 142 described with reference to FIGS. 21 to 28 becomes particularly effective when it is used as the support portion 72 of the beam 71 of the column 70 described with reference to FIGS. 14 to 19. This combination of characteristic features can further suppress occurrence of slip as a crystal defect in the wafers during heat-treating.

Figure 29:
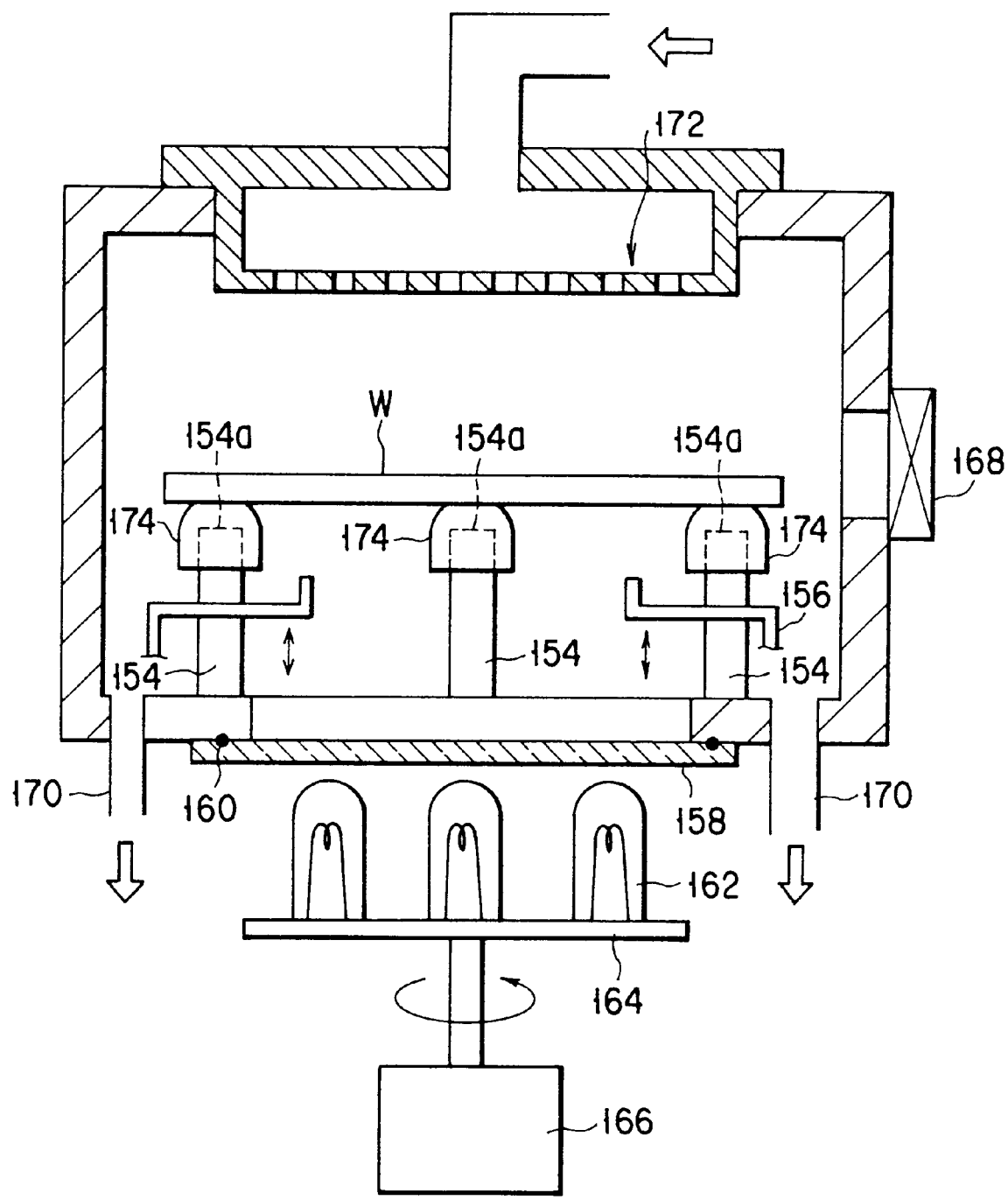
FIG. 29 is a side view showing a single-wafer heat-treating apparatus according to still another embodiment of the present invention.

FIG. 29 is a sectional view showing a single-wafer heat-treating apparatus 150 according to still another embodiment of the present invention.

The heat-treating apparatus 150 has a processing vessel 152 formed of, e.g., aluminum, into a substantially cylindrical shape. Three columns 154 stand upright in the processing vessel 152 from its bottom portion to support a target object, e.g., a semiconductor wafer W. The columns 154 are annularly arranged equidistantly, and support the peripheral edge portion of the lower surface of the wafer W with their upper ends.

Quartz lifter pins 156, which can be moved vertically by, e.g., an elevating means (not shown), are arranged near the columns 154. The lifter pins 156 push the wafer W upward when loading/unloading it.

An opening is formed in the bottom portion of the processing vessel 152, and a transmission window 158 made of, e.g., quartz glass, is hermetically arranged in this opening through a seal member 160. Under the transmission window 158, a plurality of heating lamps 162 comprising halogen lamps or the like are arranged on a rotary table 164 to serve as a heating means. The lamps 162 can heat the wafer W to a desired temperature, e.g., about 1,050° C.

The rotary table 164 is connected to a rotating mechanism 166 comprising a motor or the like so that it is rotatable, and can perform planar uniform heating of the wafer. As the heating means, a resistance heat generator may be used in place of the heating lamps 162.

A gate valve 168 through which the wafer is loaded in and unloaded from the vessel is arranged on the side wall of the processing vessel 152. Exhaust ports 170 connected to a vacuum pump (not shown) or the like are formed in the peripheral edge portion of the bottom portion of the vessel to evacuate the interior of the vessel.

A shower head 172 for supplying a process gas into the processing vessel 152 is formed on the ceiling of the processing vessel 152. When performing, e.g., oxidation, water vapor is introduced as the process gas through the shower head 172.

The columns 154 will be described in detail.

Pivotable and swingable swing elements 174 are respectively arranged on support portions 154a at the upper ends of the columns 154, as shown in FIGS. 29 and 30A. The lower surface of the wafer W is directly placed on support surfaces 174a on the upper surfaces of the swing elements 174.

Each swing element 174 is formed into a cap-like shape to loosely fit on the upper end of the columnar support portion 154a to cover it. A substantially hemispherical pivot projection 196 that can perform pivot swing is formed at substantially the central portion of the support surface 174a to extend downward. Since the pivot projection 196 is supported by the upper surface of the support portion 154a, the swing element 174 can pivot and swing. The maximum swing angle of pivot swing is set equal to that of the case of the heat-treating boat 110 described above.

The swing element 174 is also formed of SiC to have a thickness of about 0.5 mm, as described above. Concerning the manufacture of the swing element 174, it can be easily formed by coating a carbon block with SiC and evaporating only carbon by oxidation.

When the lower surface of the wafer W is placed on the swing elements 174 arranged on the distal ends of the columns 154 and the wafer W is heat-treated at a high temperature, a large thermal stress acts on the wafer. Even when the wafer W deforms, however, since the swing elements 174 swing through point contact, the support surfaces 174a are always maintained to be horizontal to the lower surface of the wafer W. Therefore, the support surfaces 174a can accept the lower surface of the wafer not through point contact but through substantially complete surface contact.

This reduces the contact surface pressure. Even when the weight of the wafer itself increases, the contact surface pressure does not increase accordingly, and occurrence of a crystal defect such as a slip can be suppressed.

Since the support surfaces 174a can accept the lower surface of the wafer not through point contact but through surface contact constantly, the lower surface of the wafer will not be damaged by, e.g., a corner portion of the swing element 174, to cause a slip, and the occurrence of slip or a crystal defect can be accordingly suppressed.

The pivot projection 196 can be arranged at the top portion of the column 154, as shown in FIGS. 30B and 30C. The section of the vertex of the pivot projection 196 may be formed to have an acute angle, as shown in FIG. 30B, or may be formed into a semicircular shape with an obtuse angle, as shown in FIG. 30C.

Furthermore, as shown in FIG. 30D, a pivot projection 196 may be formed on a swing element 174, and a recessed portion 198 for accommodating the lower end of the pivot projection 196 may be formed in the top portion of a column 154. In this case, the swing element 174 will not be displaced easily.

As shown in FIG. 31, the column 154 can have a support portion 154a whose upper portion is bent toward the center in an L-shaped manner. In this case, as a swing element 174, one having the same structure as that of the swing element 134 or 142 described concerning the boat 110 can be employed.

In the single-wafer heat-treating apparatus, the swing elements 174 need only be formed in a number corresponding to the number of columns 154. That is, only three swing elements 174 need be formed. This reduces the manufacturing cost.

The cap-like swing element 174 can also drop from the support portion during loading and unloading of the wafer W. In order to prevent this, a drop preventive mechanism 200 may be provided, as shown in FIGS. 32 to 34.

The drop preventive mechanism 200 has a through hole 202 extending laterally in a support portion 154a. Pin holes 206 are formed in the two sides of a swing element 174 to correspond to the through hole 202. A lock pin 208 is inserted in the pin holes 206 and through hole 202.

Rectangular weights 210 are attached to the two ends of the lock pin 208. The lock pin 208 is attached to the weights 210 not at their barycentric portions at their centers but at positions eccentric in either direction from the barycentric portions. Therefore, the weights 210 are rotated by their own weights, as will be described later. As shown in FIG. 33, the pin holes 206 and through hole 202 have horizontally elongated shapes so that the lock pin 208 can be loosely inserted in them such that the elongated direction of the weights 210 is set horizontally.

In assembly, the swing element 174 is placed on the support portion 154a, and the lock pin 208 is inserted in the pin holes 206 and through hole 202 such that its weights 210 are set horizontally, as shown in FIG. 33.

When the operator puts his hands off the lock pin 208, the lock pin 208 and weights 210 are rotated through 90° due to the eccentricity of the weights 210, as indicated by the imaginary line in FIG. 33. As a result, the weights 210 and the side wall of the swing element 174 interfere with each other to render the lock pin 208 difficult to remove, thereby preventing drop of the lock pin 208. The lock pin 208 and weights 210 can be molded of quartz or SiC.

In the above description, the swing elements 134, 142, and 174 are made of SiC. However, the present invention is not limited to this, and the swing elements can be made of other materials, e.g., quartz or polysilicon, having a high heat resistance.

We claim:

1. A heat-treating boat for semiconductor wafers, comprising:
    upper and lower frames disposed at upper and lower end portions, respectively, of said boat;
    a plurality of trays disposed between said upper and lower frames at gaps therebetween in a vertical direction to regulate a plurality of horizontal wafer support levels;
    first, second, and third columns disposed between said upper and lower frames and each connected to said upper and lower frames, said first, second, and third columns detachably supporting said plurality of trays and being arranged to define an inlet port through which the wafers are loaded in and unloaded from said boat;
    first and second holes formed in said upper and lower frames, respectively;
    notches formed in said trays, said first and second holes and said notches being aligned with each other in the vertical direction; and
    a rod detachably connected to said upper and lower frames through said first and second holes and inserted in said notches to position said plurality of trays relative to said first, second, and third columns.

2. The boat according to claim 1, wherein said first hole formed in said upper frame comprises a through hole through which said rod can be inserted, and said rod is detachably fitted in said notch through said first hole.

3. The boat according to claim 1, further comprising a first stopper extending in the vertical direction between said upper and lower frames and fixed relative to said upper and lower frames, and contact elements respectively disposed on said trays to be able to come into contact with said first stopper, wherein said plurality of trays are fixed relative to said first, second, and third columns by cooperation of engagement of said first stopper and said contact elements and engagement of said notches and said rod.

4. The boat according to claim 3, wherein said first stopper comprises a side surface of one of said first, second, and third columns.

5. The boat according to claim 3, wherein said contact elements comprise projections formed on said trays.

6. The boat according to claim 3, wherein said contact elements comprise notches formed in said trays.

7. The boat according to claim 6, wherein said first stopper comprises another rod detachably connected to said upper and lower frames.

8. The boat according to claim 3, further comprising a second stopper extending in the vertical direction between said upper and lower frames and fixed relative to said upper and lower frame, wherein, while said notches and said rod are engaged with each other, said rod and said second stopper are engaged with each other.

9. The boat according to claim 8, wherein said second stopper comprises a side surface of one of said first, second, and third columns.

10. The boat according to claim 1, wherein said notches comprise through holes formed in said trays, respectively.

* * * * *